(12) United States Patent
Arao

(10) Patent No.: US 9,362,273 B2
(45) Date of Patent: Jun. 7, 2016

(54) SEMICONDUCTOR DEVICE AND METHOD OF MANUFACTURING THE SAME

(71) Applicant: Semiconductor Energy Laboratory Co., Ltd., Atsugi (JP)

(72) Inventor: Tatsuya Arao, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 13/689,041

(22) Filed: Nov. 29, 2012

(65) Prior Publication Data

US 2013/0126973 A1    May 23, 2013

Related U.S. Application Data

(62) Division of application No. 11/584,526, filed on Oct. 23, 2006, now abandoned, which is a division of application No. 10/132,234, filed on Apr. 26, 2002, now Pat. No. 7,132,317.

(30) Foreign Application Priority Data

Apr. 27, 2001 (JP) ................................ 2001-130639

(51) Int. Cl.
   *H01L 23/62* (2006.01)
   *H01L 27/088* (2006.01)
   (Continued)

(52) U.S. Cl.
   CPC .......... *H01L 27/088* (2013.01); *H01L 27/1214* (2013.01); *H01L 29/4908* (2013.01);
   (Continued)

(58) Field of Classification Search
   CPC .................. H01L 27/1203; H01L 21/823807; H01L 7/0922
   USPC .......... 257/204, 338, 347, 351, 357, 369, 382
   See application file for complete search history.

(56) References Cited

U.S. PATENT DOCUMENTS 3,793,090 A    2/1974  Barile et al.
5,010,024 A    4/1991  Allen et al.
(Continued)

FOREIGN PATENT DOCUMENTS

EP    0 373 893 A    6/1990
EP    1022786 A      7/2000
(Continued)

OTHER PUBLICATIONS

Ito, et al., "Stress Effect of an Etch-Stop Nitride Film on 0.13 μm CMOS Transistor Performance Mechanical Stress Effect of Etch-Stop Nitride and its Impact on Deep Submicron Transistor Design," Silicon Technology, No. 25, Jan. 24, 2001, pp. 36-39.

*Primary Examiner* — Jack Chen
(74) *Attorney, Agent, or Firm* — Robinson Intellectual Propery Law Office; Eric J. Robinson

(57) ABSTRACT

There has been a case where peeling occurs if an internal stress of a wiring of a TFT is strong. In particular, the internal stress of a gate electrode largely influences a stress that a semiconductor film receives, and there has been a case where the internal stress becomes a cause of reduction in electric characteristics of a TFT depending on the internal stress. According to the present invention, an impurity element is introduced into a wiring, or both the introduction of an impurity element and heat treatment are performed, whereby the wiring can be controlled to have a desired internal stress. It is effective that the present invention is particularly applied to a gate electrode. Further, it is possible that the introduction of an impurity element and the heat treatment are conducted to only a desired region to conduct control to attain a desired internal stress.

21 Claims, 23 Drawing Sheets

(51) Int. Cl.
*H01L 27/12* (2006.01)
*H01L 29/49* (2006.01)
*H01L 29/66* (2006.01)
*H01L 29/78* (2006.01)
*H01L 29/786* (2006.01)
*H01L 27/32* (2006.01)

(52) U.S. Cl.
CPC ...... *H01L29/66757* (2013.01); *H01L 29/7842* (2013.01); *H01L 29/78603* (2013.01); *H01L 29/78621* (2013.01); *H01L 29/78633* (2013.01); *H01L 27/3244* (2013.01); *H01L 29/78645* (2013.01); *H01L 2924/0002* (2013.01)

(56) References Cited

U.S. PATENT DOCUMENTS

| | | | |
|---|---|---|---|
| 5,040,037 A | 8/1991 | Yamaguchi et al. | |
| 5,188,706 A | 2/1993 | Hori et al. | |
| 5,518,936 A | 5/1996 | Yamamoto et al. | |
| 5,738,948 A | 4/1998 | Ikeda et al. | |
| 5,847,419 A * | 12/1998 | Imai et al. | 257/192 |
| 5,904,508 A | 5/1999 | Codama et al. | |
| 5,946,551 A | 8/1999 | Dimitrakopoulos et al. | |
| 5,990,542 A | 11/1999 | Yamazaki | |
| 5,999,236 A | 12/1999 | Nakajima et al. | |
| 6,063,654 A | 5/2000 | Ohtani | |
| 6,063,686 A | 5/2000 | Masuda et al. | |
| 6,107,660 A | 8/2000 | Yang et al. | |
| 6,214,733 B1 | 4/2001 | Sickmiller | |
| 6,255,695 B1 | 7/2001 | Kubota et al. | |
| 6,278,132 B1 * | 8/2001 | Yamazaki et al. | 257/69 |
| 6,339,013 B1 | 1/2002 | Naseem et al. | |
| 6,358,766 B1 | 3/2002 | Kasahara | |
| 6,362,082 B1 | 3/2002 | Doyle et al. | |
| 6,376,340 B1 | 4/2002 | Sato et al. | |
| 6,380,558 B1 | 4/2002 | Yamazaki et al. | |
| 6,420,758 B1 | 7/2002 | Nakajima | |
| 6,441,468 B1 | 8/2002 | Yamazaki | |
| 6,445,059 B1 | 9/2002 | Yamazaki | |
| 6,450,654 B1 | 9/2002 | Koester | |
| 6,455,397 B1 | 9/2002 | Belford | |
| 6,492,659 B1 | 12/2002 | Yamazaki et al. | |
| 6,548,331 B2 | 4/2003 | Lee et al. | |
| 6,590,229 B1 | 7/2003 | Yamazaki et al. | |
| 6,596,573 B2 | 7/2003 | Lee et al. | |
| 6,605,497 B2 | 8/2003 | Yamazaki et al. | |
| 6,713,824 B1 | 3/2004 | Mikata et al. | |
| 6,717,213 B2 | 4/2004 | Doyle et al. | |
| 6,730,551 B2 | 5/2004 | Lee et al. | |
| 6,740,913 B2 | 5/2004 | Doyle et al. | |
| 6,750,486 B2 | 6/2004 | Sugawara et al. | |
| 6,762,081 B2 | 7/2004 | Yamazaki et al. | |
| 6,787,887 B2 | 9/2004 | Yamazaki | |
| 6,803,601 B2 | 10/2004 | Nakajima | |
| 6,841,430 B2 | 1/2005 | Sugawara et al. | |
| 6,890,784 B2 | 5/2005 | Yamazaki et al. | |
| 6,890,805 B2 | 5/2005 | Yamazaki et al. | |
| 6,982,465 B2 | 1/2006 | Kumagai et al. | |
| 7,034,381 B2 | 4/2006 | Yamazaki | |
| 7,052,946 B2 * | 5/2006 | Chen et al. | 438/199 |
| 7,115,954 B2 | 10/2006 | Shimizu et al. | |
| 7,202,499 B2 | 4/2007 | Nakajima | |
| 7,202,551 B2 | 4/2007 | Yamazaki | |
| 7,208,766 B2 | 4/2007 | Yamazaki et al. | |
| 7,411,253 B2 | 8/2008 | Shimizu et al. | |
| 7,413,937 B2 | 8/2008 | Yamazaki | |
| 7,414,267 B2 | 8/2008 | Yamazaki et al. | |
| 7,414,293 B2 | 8/2008 | Shimizu et al. | |
| 7,579,229 B2 | 8/2009 | Sugii et al. | |
| 7,705,402 B2 | 4/2010 | Shimizu et al. | |
| 7,727,836 B2 | 6/2010 | Yamazaki et al. | |
| 8,304,810 B2 | 11/2012 | Sugii et al. | |
| 2001/0032980 A1 | 10/2001 | Hayashi et al. | |
| 2002/0005905 A1 | 1/2002 | Yamazaki et al. | |
| 2002/0186444 A1 | 12/2002 | Koester | |
| 2005/0017236 A1 | 1/2005 | Sugii et al. | |
| 2005/0189592 A1 | 9/2005 | Yamazaki et al. | |
| 2009/0039427 A1 | 2/2009 | Shimizu et al. | |

FOREIGN PATENT DOCUMENTS

| | | |
|---|---|---|
| EP | 1054452 A | 11/2000 |
| EP | 1174928 A | 1/2002 |
| JP | 01-241854 A | 9/1989 |
| JP | 02-159767 A | 6/1990 |
| JP | 07-115203 A | 5/1995 |
| JP | 07-131025 A | 5/1995 |
| JP | 07-225395 A | 8/1995 |
| JP | 08-153722 A | 6/1996 |
| JP | 08-236499 A | 9/1996 |
| JP | 09-219525 A | 8/1997 |
| JP | 10-098179 A | 4/1998 |
| JP | 10-148844 A | 6/1998 |
| JP | 10-270363 | 10/1998 |
| JP | 11-121760 A | 4/1999 |
| JP | 11-340337 A | 12/1999 |
| JP | 2000-036603 A | 2/2000 |
| JP | 2000-091592 A | 3/2000 |
| JP | 2000-196100 A | 7/2000 |
| JP | 2000-216399 A | 8/2000 |
| JP | 2000-276076 A | 10/2000 |
| JP | 2000-286418 A | 10/2000 |
| JP | 2001-053285 A | 2/2001 |
| JP | 2001-060691 A | 3/2001 |
| JP | 2002-093921 A | 3/2002 |
| JP | 2003-086708 A | 3/2003 |
| WO | 2002/043151 | 5/2002 |

* cited by examiner

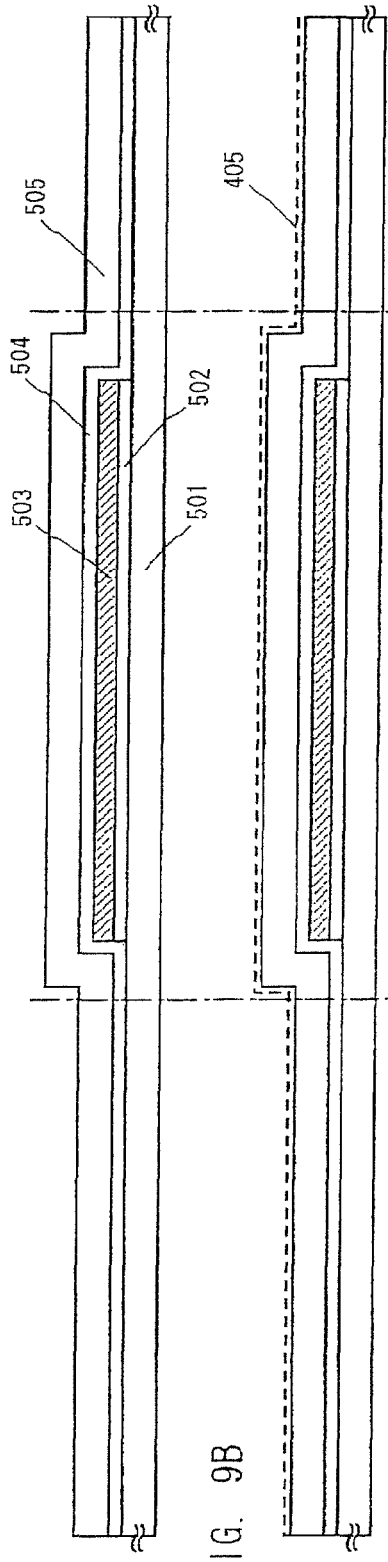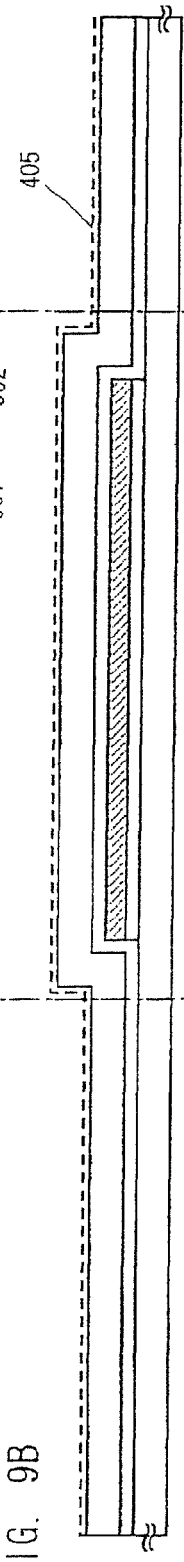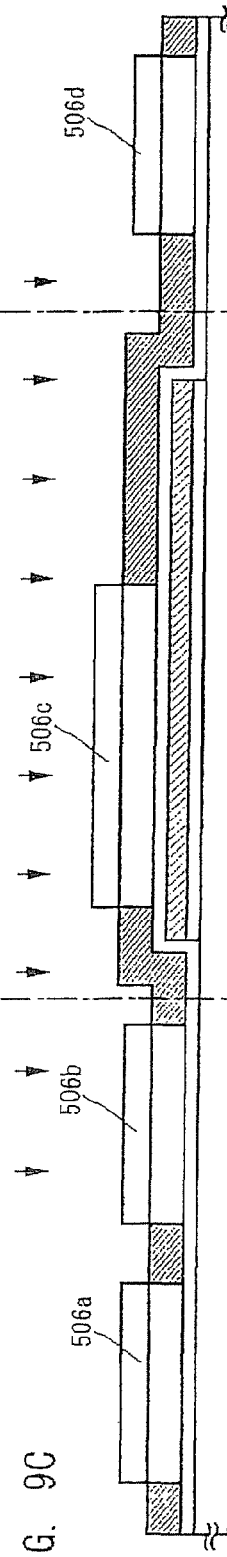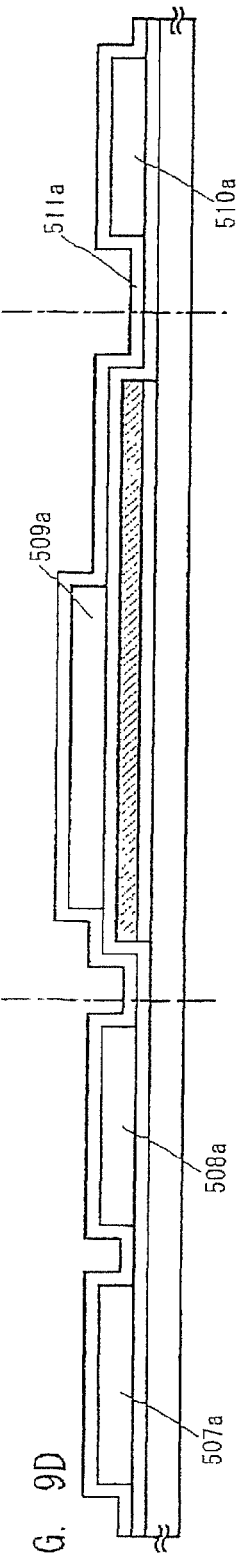

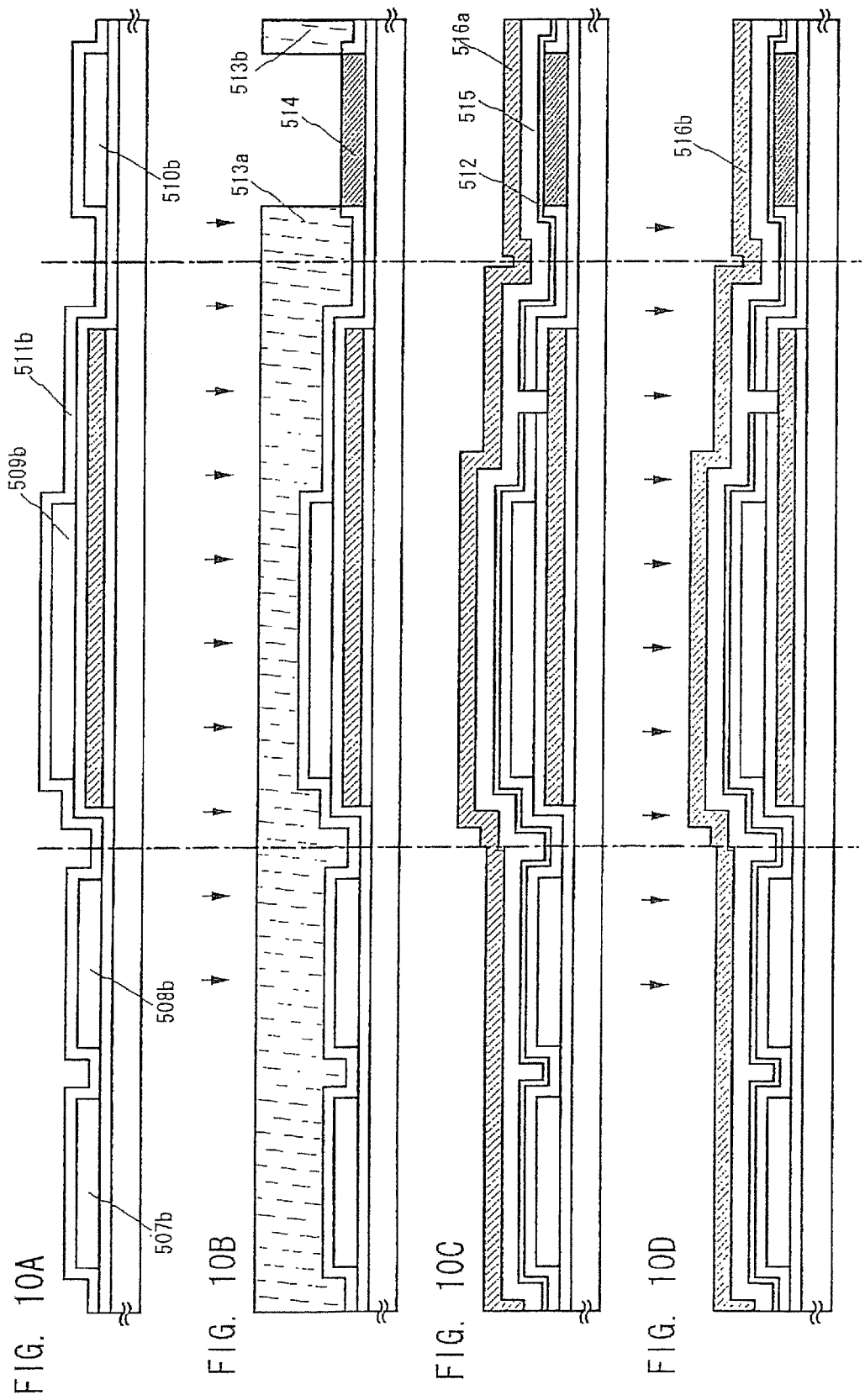

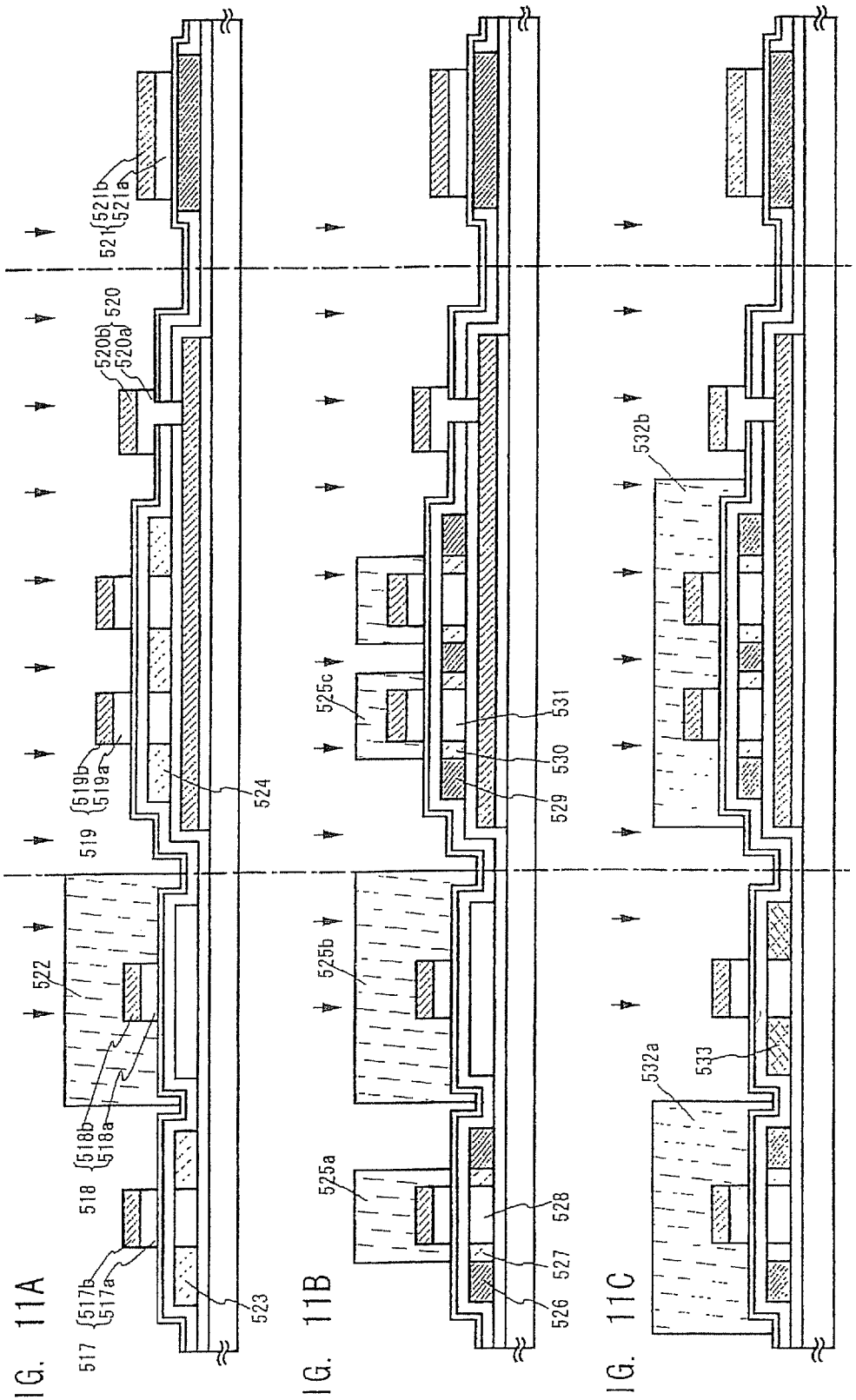

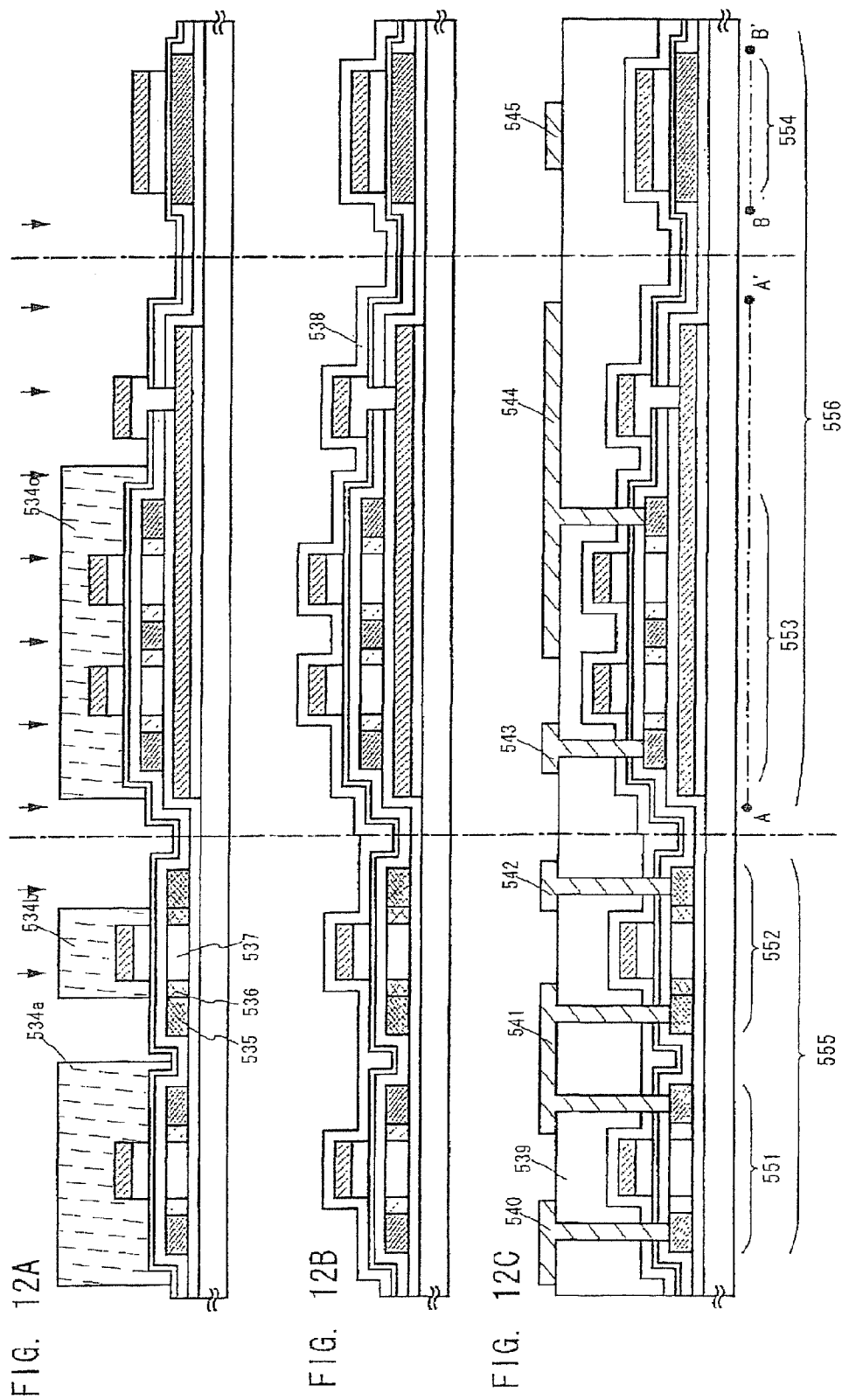

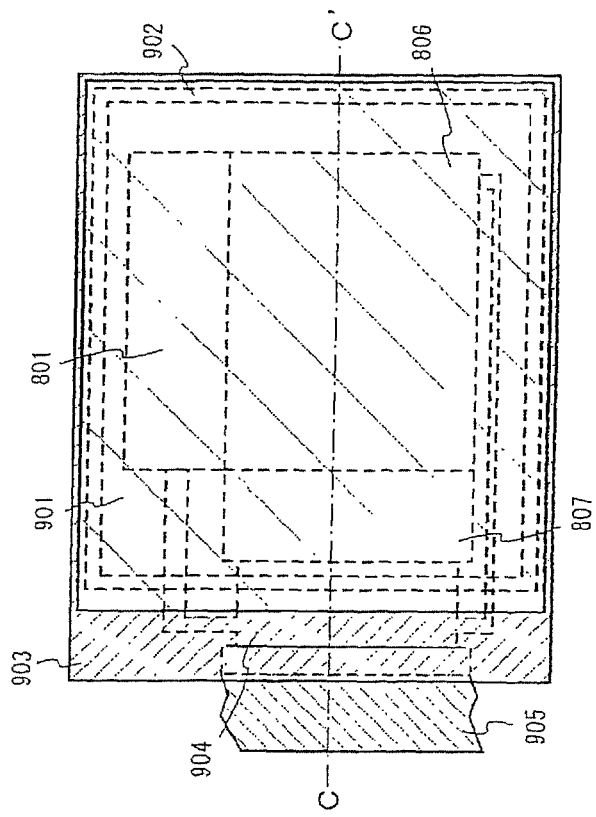
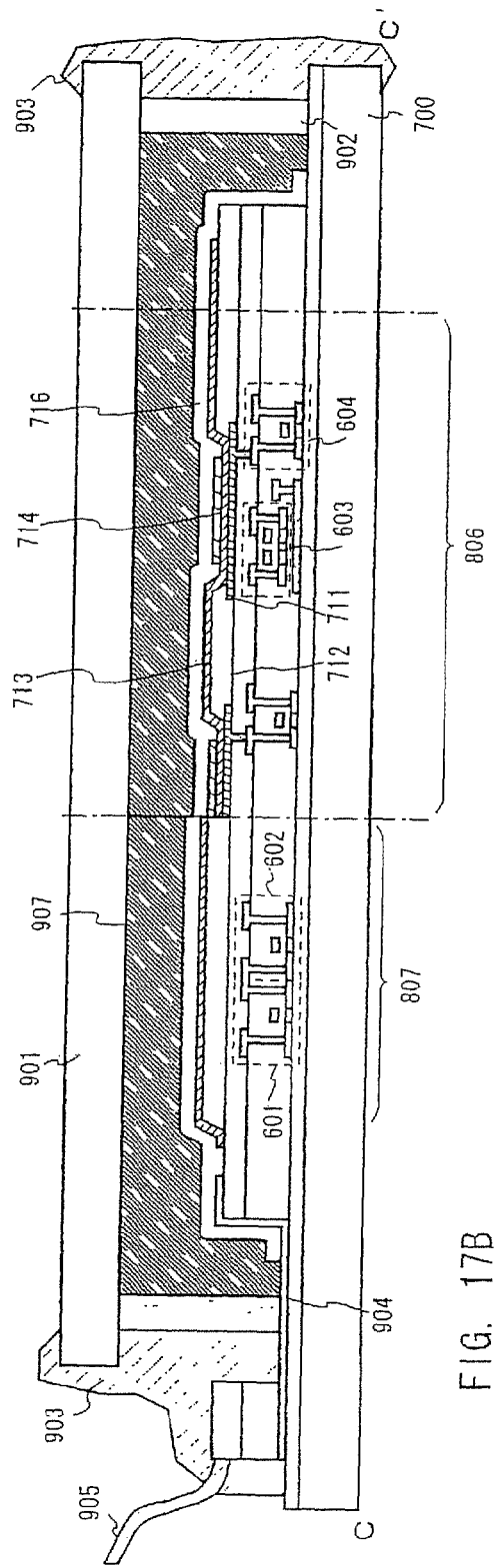
FIG. 17A
FIG. 17B

SEMICONDUCTOR DEVICE AND METHOD OF MANUFACTURING THE SAME

BACKGROUND OF THE INVENTION

1. Field of the Invention

The present invention relates to a semiconductor device having a circuit composed of a thin film transistor (hereinafter referred to as TFT) and a method of manufacturing the same. In particular, the present invention relates to an electro-optical device typified by a liquid crystal display device, a semiconductor device mounted with the electro-optical device as its component and a method of manufacturing the semiconductor device. Note that, the semiconductor device in this specification indicates devices in general being capable of functioning with the use of semiconductor characteristics, and electro-optical devices, semiconductor circuits and electronic equipment are all included in the semiconductor devices.

2. Description of the Related Art

In recent years, the development of a semiconductor device including a large-area integrated circuit formed from a TFT-constituted of a thin film (thickness of approximately several to several hundreds of nm) formed on a substrate having an insulating surface has been progressing. As typical examples of the semiconductor device, an active matrix liquid crystal display device and a light emitting device are known. In particular, since the TFT in which a crystalline silicon film is used for an active region has high electric field mobility, it can constitute various function circuits.

For example, in the active matrix liquid crystal display device a pixel circuit for conducting image display for each functional block and a driver circuit, which is mainly composed of a CMOS circuit, for controlling the pixel circuit, such as a shift register circuit, a level shifter circuit, a buffer circuit or a sampling circuit, are formed on one substrate.

Further, the TFT comprises at least a semiconductor film, an insulating film constituted of a silicon oxide film, a silicon oxynitride film or the like, and wirings constituted of various metal materials. The wirings include a source wiring, a gate wiring (including a gate electrode), and the like. These films each have a thickness of approximately several to several hundreds of nm, and thus, can be said to be thin films.

These thin films are formed by known film formation techniques such as CVD (chemical vapor phase growth method) and sputtering. However, it is known that the thin film has an internal stress. Note that the internal stress includes an intrinsic stress and a thermal stress that arises from a difference in a thermal expansion coefficient between the thin film and a substrate.

The influence of the thermal stress can be disregarded by taking a material for a substrate, a process temperature, a pressure and the like into consideration. However, the generation mechanism of the intrinsic stress has not been absolutely made clear. It is rather considered that the intrinsic stress is generated due to a phase change and a composition change which are complicatedly interwound with each other and caused in a film growth process or by the subsequent heat treatment.

The internal stress generally includes a compressive stress and a tensile stress. As shown in FIG. 5A, when a thin film 311 is to expand, a substrate 312 is compressed and formed such that the thin film 311 is on the outside thereof. This is called the compressive stress. On the other hand, as shown in FIG. 5B, when the thin film 311 is to contract with respect to the substrate 312, the substrate 312 pulls the thin film 311 in a direction in which the contraction is hindered so that the substrate 312 deforms such that the thin film is on the inside thereof. This is called the tensile stress. In general, the value of the tensile stress is shown with "+", and the value of the compressive stress is shown with "−" in many cases.

The influence of the internal stress described above on electric characteristics of a transistor is described in, for example, "Influence of Stress of Etch Stop Nitride Film to 0.13 µm CMOS Transistor Performance; Applied Physics Society Silicon Technology Section No. 25 Special Number on ULSI Device (2001) pp 36-39." According to this, it is reported that the mobility of an NMOS transistor is enhanced when a channel forming region thereof receives a tensile stress while the mobility of a PMOS transistor is enhanced when a channel forming region thereof receives a compressive stress.

As described above, a wiring of a TFT is formed from a thin film. Therefore, the wiring also has an internal stress, and there has been a case where peeling is is generated if the internal stress is strong. Further, a gate electrode formed from the same material as that for the wiring is formed on a semiconductor film through an insulating film. The internal stress of the gate electrode acts on even the semiconductor film, and imparts distortion to an interface between the insulating film and the semiconductor film or the semiconductor film. Thus, there is a case where electric characteristics typified by a threshold voltage and electric field mobility are affected.

SUMMARY OF THE INVENTION

The present invention has been made to solve the above-described problem, and an object of the present invention is therefore to improve operational characteristics of a semiconductor device and improve yield in an electro-optical device and a semiconductor device typified by an active matrix liquid crystal display device having a wiring.

In the present invention, an impurity element is introduced into a wiring of a TFT, or the introduction of an impurity element and heat treatment are both conducted. Thus, the wiring can be controlled to have a desired internal stress. In particular, it is very effective that the present invention is applied to a gate electrode. That is, the stress applied to an active layer (particularly, a channel forming region) can be set to a desired stress by controlling the internal stress of the gate electrode. Further, when a gate insulating film is made thinner as a transistor is miniaturized, the influence of the stress applied on the active layer becomes conspicuous. Thus, the control of the internal stress of the gate electrode becomes important more and more. Furthermore, it is also possible to control the internal stress of the gate electrode to a desired internal stress by introducing an impurity element only into a desired region or conducting heat treatment.

For example, by applying the present invention, it is possible that the stress that a channel forming region in an n-channel TFT receives is set as a tensile stress while the stress that a channel forming region in a p-channel TFT receives is set as a compressive stress. Further, it is also possible that the tensile stress in the channel forming region in the n-channel TFT is relatively made stronger than that in the channel forming region in the p-channel TFT and that the compressive stress in the channel forming region in the p-channel TFT is relatively made stronger than that in the channel forming region in the n-channel TFT. By adopting the above, electric characteristics of the TFT can be made satisfactory, and operational characteristics of the semiconductor device can also be remarkably improved.

Plasma doping, ion implantation, ion shower doping or the like may be conducted as a method of introducing an impurity element. In such a method of introducing an impurity element, energy of ions implanted into a thin film is extremely larger than binding energy of elements constituting the thin film. Therefore, the ions implanted into the thin film may repel atoms constituting the semiconductor film from lattice points and exist at the lattice positions, or the atoms repelled from the lattice points by the implanted ions may exist at the positions in the lattice. In this way, a thin film is expanded. Thus, in a case where the thin film has a compressive stress, the compressive stress increases, and in a case where the thin film has a tensile stress, the to tensile stress is relaxed.

Further, since the atoms existing at the positions in the lattice return to the lattice positions due to heat treatment, regularity of atomic arrangement is improved. Thus, the thin film is contracted. Therefore, in a case where the thin film has a tensile stress, the tensile stress increases, and in a case where the thin film has a compressive 51 stress, the compressive stress is relaxed.

Further, when the introduction of the impurity-element is conducted after the heat treatment is conducted, accelerated ions are implanted into the film in which the regularity of an atomic arrangement is improved. Thus, it becomes possible for the ions to enter to depths along an opening in a crystal lattice without causing a collision (channeling). Therefore, the introduction of the impurity element for controlling the internal stress only requires a small dose amount, and can be conducted with a low accelerating voltage.

Further, when the heat treatment is conducted after the introduction of the impurity element, a larger number of atoms than the number of atoms for forming a thin film are introduced into the thin film. Thus, a larger number of atoms than the number of atoms that return to the lattice position exist as the atoms existing at the position in the lattice. Therefore, the contraction of the thin film is smaller in comparison with the case where the introduction of the impurity element is not conducted, and thus, the increase amount of the tensile stress becomes small. In other words, in the case where it is clear that the heat treatment is conducted in the subsequent step, the change amount of the internal stress can be made small by previously introducing the impurity element.

As described above, the introduction of the impurity element, or both the introduction of the impurity element and the heat treatment are conducted, whereby the internal stress can be controlled to a desired level. Of course, the number of times of the introduction of the impurity element or heat treatment is not limited to one, and a plurality of times may be adopted. In the present invention, the characteristics described above are applied to a wiring to control a stress of the wiring, thereby improving the operational characteristics of a semiconductor device. Particularly, the internal stress in a gate electrode of a TFT is controlled, whereby the stress that a semiconductor film receives can be controlled. Therefore, the electric characteristics typified by a threshold voltage and field effect mobility can be improved. Further, the stress of respective gate electrodes can be controlled, and thus, variation of the electric characteristics can be suppressed.

A method of manufacturing a semiconductor device according to the present invention disclosed in this specification is characterized by comprising: forming an insulating film on a first semiconductor film and a second semiconductor film which are formed on an insulating surface; forming a first conductive film on the first semiconductor film and a second conductive film on the second semiconductor film through the insulating film: introducing a first impurity element into the first conductive film and the first semiconductor film to change an internal stress of the first conductive film and making a stress that the first semiconductor film receives a tensile stress; introducing a second impurity element into the second conductive film and the second semiconductor film to change an internal stress of the second conductive film and making a stress that the second semiconductor film receives a compressive stress; and manufacturing an n-channel TFT by using the first semiconductor film, the insulating film and the first conductive film and manufacturing a p-channel TFT by using the second semiconductor film, the insulating film and the second conductive film.

In the above manufacturing method, a method of introducing the first impurity element or the second impurity element can be conducted by plasma doping, ion implantation, ion shower doping or the like.

Further, in the above manufacturing method, there is no particular limitation on the first impurity element and the second impurity element, but it is desirable that the first impurity element is one or a plurality of elements selected from impurity elements imparting n-type conductivity and rare gas elements and that the second impurity element is one or a plurality of elements selected from impurity elements imparting n-type conductivity, impurity elements imparting p-type conductivity and rare gas elements. The impurity elements imparting n-type conductivity and the impurity elements imparting p-type conductivity are impurity elements indispensable for formation of a source region and a drain region. Thus, other impurity elements do not need to be newly prepared, which is economical. Particularly in a case where an impurity element is introduced into a gate electrode, this can be conducted simultaneously with the step of introducing the impurity element into the source region and the drain region. Thus, this is preferable since the introduction can be conducted without increasing the number of steps. Further, the rare gas element is an inert element, and thus, is preferable in a point that the rare gas element does not affect the electric characteristics of a TFT.

Further, as the introduction amount of the impurity element is larger, in a case where an internal stress in a thin film is a compressive stress, the compressive stress increases while in a case where the internal stress in a thin film is a tensile stress, the tensile stress is relaxed, and then, a compressive stress may increase. That is, the internal stress in a thin film may become a compressive stress or become a tensile stress in accordance with the introduction amount of the impurity element.

Further, in the above manufacturing method, it is desirable that the value of the internal stress in the conductive film is ±1 GPa or less. It is known that peeling occurs if the internal stress of the conductive film is strong, and a standard of the internal stress which can suppress the occurrence of peeling is generally ±1 GPa or less. Of course, the occurrence of peeling largely affects the condition for forming the conductive film or the like.

Further, in the respective above manufacturing methods, the conductive film is not limited to a single layer thereof and may be a lamination structure of two or more layers thereof.

Further, in the respective above manufacturing methods, RTA, laser annealing, thermal annealing using an annealing furnace may be applied for the heat treatment.

Further, the heat treatment largely affects the change of the internal stress in the thin film depending on the time or temperature. As the time for the heat treatment becomes longer or the temperature of the heat treatment becomes higher, in the case where the internal stress in the thin film is a tensile stress, the tensile stress increases while in the case where the internal stress in the thin film is a compressive stress, the internal stress may become a tensile stress after the compressive stress is relaxed. That is, depending on the heat treatment condition, there may be a case where the internal stress in the thin film becomes a compressive stress and a case where the internal stress in the thin film becomes a tensile stress.

Hereafter, the structure of the present invention is shown.

The present invention relates to a semiconductor device including an n-channel TFT and a p-channel TFT, characterized in that the n-channel TFT has a first semiconductor film and a first conductive film formed on the first semiconductor film, the p-channel TFT has a second semiconductor film and a second conductive film formed on the semiconductor film, the first semiconductor film receives a tensile stress, the second semiconductor film receives a compressive stress, and impurity elements are introduced into the first conductive film and the second conductive film.

In the above-described structure, the first impurity element is not particularly limited, but is desirably one or a plurality of elements selected from impurity elements imparting n-type conductivity, impurity elements imparting p-type conductivity and rare gas elements. Also, different impurity elements may be introduced. The impurity element imparting n-type conductivity and the impurity element imparting p-type conductivity are impurity elements indispensable for formation of a source region and a drain region. Therefore, it is not necessary to newly prepare other impurity elements, which is economical. Particularly, in a case where the impurity element is introduced into a gate electrode, this introduction can be conducted simultaneously with the step of introducing the impurity element into the source region and drain region. Thus, this is preferable since the introduction can be conducted without increasing the number of steps. Further, since the rare gas element is an inert element, the element is preferable in the point that electric characteristics of a TFT are not affected.

Further, in the above-described structure, a peak concentration of the first impurity element in the first conductive film or the second impurity element in the second conductive film is desirably in a range of $1 \times 10^{-7}$ to $1 \times 10^{22}/cm^3$. This concentration range is required for realizing function of the source region and the drain region. When the introduction of the impurity element for forming the source region and the drain region is conducted after the formation of the first conductive film and the second conductive film, the impurity elements are respectively introduced into the first conductive film and the second conductive film at the same level.

Further, in the above-described structure, it is desirable that the concentration of the first impurity element introduced into the first conductive film is different from the concentration of the second impurity element introduced into the second conductive film. In order to make the stress applied to the first semiconductor film forming the n-channel TFT and the stress applied to the second semiconductor film forming the p-channel TFT different from each other to thereby improve the electric characteristics of the respective TFTs, it is required that the impurity element concentration is made different between the first conductive film and the second conductive film to make the stress different between both the conductive films. Of course, if the first impurity element and the second impurity element are different from each other, there may be a case where the stress differs between the first conductive film and the second conductive film even if the concentration is the same between both the conductive films.

Further, the method of the present invention is characterized in that a semiconductor device typified by a liquid crystal display device or a light emitting device is formed by using a TFT provided with each of the structures.

As described above, in the present invention, an impurity element is introduced into a wiring, or the introduction of the impurity element and heat treatment are both conducted, whereby it becomes possible to control an internal stress of the wiring to a desired level. Therefore, patterning of the wiring can be conducted satisfactorily. Further, it is extremely effective that the present invention is applied to a gate electrode to control the stress applied to an active layer (particularly channel forming region). In addition, the TFT manufactured by applying the present invention enables improvement of electric characteristics typified by a threshold voltage and field effect mobility.

Furthermore, a semiconductor device typified by an active matrix liquid crystal display device which has the TFT manufactured by applying the present invention can realize improvement of operational characteristics of the semiconductor device and improvement of yield.

BRIEF DESCRIPTION OF THE DRAWINGS

In the accompanying drawings:

FIGS. 9A to 9D are sectional views showing a manufacturing process of a pixel TFT and a driver circuit TFT;

FIGS. 10A to 10D are sectional views showing the manufacturing process of a pixel TFT and a driver circuit TFT;

FIGS. 11A to 11C are sectional views showing the manufacturing process of a pixel TFT and a driver circuit TFT;

FIGS. 12A to 12C are sectional views showing the manufacturing process of a pixel TFT and a driver circuit TFT;

FIGS. 17A and 17B are a top surface view of the light emitting device and a schematically sectional view of the driver circuit and the pixel portion of the light emitting device, respectively:

DETAILED DESCRIPTION OF THE PREFERRED EMBODIMENTS

[Embodiment Mode 1]

An embodiment mode of the present invention will be described with reference to FIGS. 1A to 1D. In this embodiment mode, a case where the present invention is applied to a gate electrode of a TFT will be described.

First, a base insulating film 11 is formed on a substrate 10. As the substrate 10, a glass substrate, a quartz substrate, a single crystal silicon substrate; a metal substrate, a stainless steel substrate, or a flexible substrate may be used. Also, a plastic substrate having heat resistance that can withstand a process temperature may be used. As the glass substrate, a substrate made of glass such as barium borosilicate glass or alumino borosilicate glass can be given. An insulating film may be formed on the metal substrate or stainless steel substrate. Further, the flexible substrate indicates a film substrate made of PET, PES, PEN, acrylic or the like. If a semiconductor device is manufactured by using the flexible substrate, the effect of reducing the device in weight is expected. It is desirable to form, on a front surface of the flexible substrate or on both a front surface and a rear surface thereof, a single layer or a multilayer of a barrier layer formed of an aluminum film (AlON, AlN, AlO or the like), a carbon film (DLC (diamond-like carbon) or the like), SiN or the like since the durability of the substrate is improved.

Further, the base insulating film 11 comprising an insulating film such as a silicon oxide film, a silicon nitride film or a silicon oxynitride film is formed. An example of a single layer structure of the base insulating film 11 is shown here, but a structure in which two or more layers of the insulating film are laminated may be adopted. Note that the base insulating film 11 may not be formed.

Next, a semiconductor film 12 is formed on the base insulating film 11. As to the semiconductor film 12, a semiconductor film having an amorphous structure is deposited by a known means (sputtering, LPCVD, plasma CVD, or the like), and then, a known crystallization process (laser crystallization, thermal crystallization, thermal crystallization using a catalyst such as nickel, or the like) is conducted thereto, thereby forming a crystalline semiconductor film. The semiconductor film 12 is formed to have a thickness of 25 to 200 nm (preferably 30 to 100 nm). There is no limitation on a material for the semiconductor film, but the semiconductor film is preferably formed from silicon or an alloy of silicon germanium (SiGe).

Figure 1A:
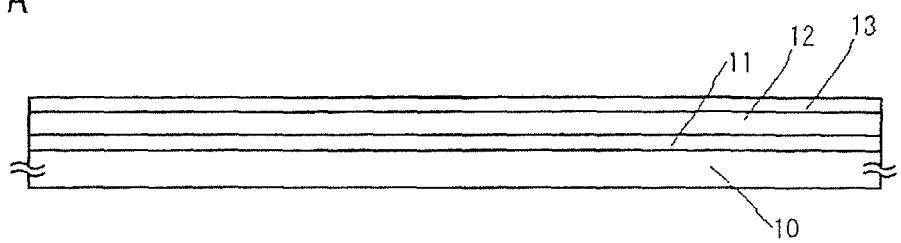
FIGS. 1A to 1D are views showing an example of the concept of the present invention.

Then, an insulating film 13 is formed on the semiconductor film 12. The insulating film 13 comprises a single layer or a lamination structure of an insulating film containing silicon to have a thickness of 40 to 150 nm by using plasma CVD, sputtering or the like. Note that the insulating film 13 becomes a gate insulation film. (FIG. 1A)

Figure 1B:
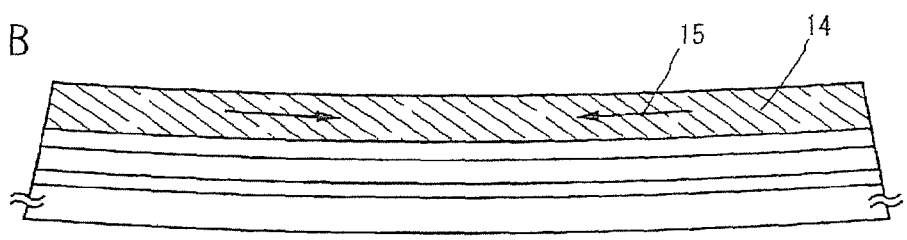

Next, a conductive film 14 with a thickness of 250 to 600 nm is formed on the insulating film 13 by using sputtering, plasma CVD or the like. An example of a single layer structure of the conductive film 14 is shown here, but a structure in which two or more layers of the conductive film are laminated may be adopted. (FIG. 1B)

However, there is a case where a tensile stress 15 of the conductive film 14 is strong when the conductive film 14 is formed by CVD. Therefore, introduction of an impurity element is conducted to relax an internal stress in the conductive film 14, thereby obtaining a desired internal stress. The introduction of an impurity element may be conducted by plasma doping, ion implantation, ion shower doping or the like. Further, as the impurity element for introduction, one or a plurality of elements selected from impurity elements imparting n-type conductivity, impurity elements imparting p-type conductivity and rare gas elements are used, and the introduction is performed with an accelerating voltage of 30 to 120 keV, a dose amount of $1\times10^{12}$ to $9\times10^{16}/cm^2$, and a peak concentration of $1\times10^{17}$ to $1\times10^{22}/cm^3$. (FIG. 1C) Of course, the optimum conditions for the impurity element introduction differ depending on the state of the conductive film or a desired internal stress. Further, if an impurity element is introduced only to a desired region by using a mask made of resist, it is possible to change the internal stress only in the desired region.

The internal stress of the conductive film thus formed is a desired internal stress, and the stress applied to the semiconductor film can be reduced or set to the desired stress. Then, when a TFT is manufactured by using such a conductive film, the electric characteristics thereof become satisfactory, and the operational characteristics of a semiconductor device can be remarkably improved.

[Embodiment Mode 2]

An embodiment mode of the present invention will be described with reference to FIGS. 1A to 1D. In this embodiment mode, a case where heat treatment is conducted after introduction of an impurity element, thereby controlling an internal stress is described.

Figure 1C:
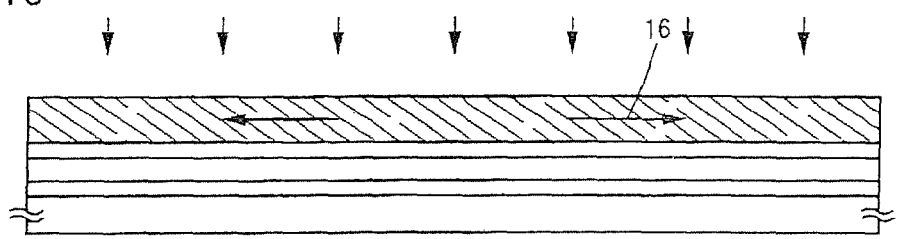
Figure 1D:
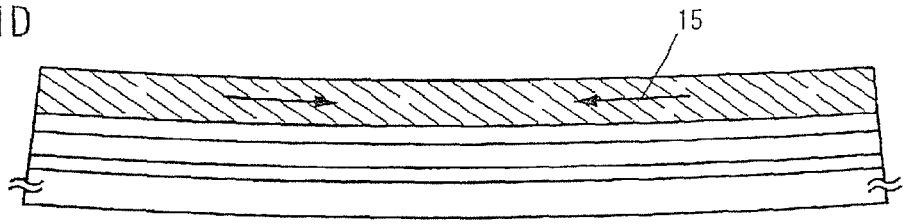

First, the steps up through impurity element introduction are conducted in accordance with Embodiment Mode 1. (FIG. 1C)

Subsequently, the heat treatment is conducted. The internal stress in the conductive film 14 increases if it is a tensile stress while the internal stress is relaxed if it is a compressive stress. A known method such as thermal annealing using an annealing furnace, laser annealing or RTA may be employed for the heat treatment. For example, if thermal annealing using an annealing furnace is conducted, it is to sufficient that a substrate is exposed to a nitrogen atmosphere approximately at 500 to 1000° C. for about 3 minutes to 12 hours. Of course, the optimum conditions for the heat treatment differ depending on the state of the conductive film or desired internal stress. Further, when the heat treatment for a long time is conducted simultaneously with crystallization of a semiconductor film in a manufacturing process of a TFT or is activation of an impurity element, it can be conducted without increasing the number of steps, which is effective.

Further, when the heat treatment is conducted only to a desired region by laser annealing or the like, it is possible to change the internal stress only in the desired region. As a laser used in laser annealing, a solid laser, gas laser or metal laser of continuous emission or pulse oscillation type is desired. Note that examples of the solid laser include a YAG laser, $YVO_4$ laser, YLF laser, $YAlO_3$ laser, glass laser, ruby laser, alexandrite laser. Ti:sapphire laser and the like of continuous emission or pulse oscillation type. Examples of the gas laser include an excimer laser, Ar laser, Kr laser. $CO_2$ laser and the like of continuous emission or pulse oscillation type. As the metal lasers, a helium cadmium laser, copper vapor laser and gold vapor laser can be given.

The internal stress of the conductive film thus formed is a desired internal stress, and the stress applied to the semiconductor film can be reduced or set to the desired stress. Then, when a TFT is manufactured by using such a conductive film, the electric characteristics thereof become satisfactory, and the operational characteristics of a semiconductor device can be remarkably improved.

[Embodiment Mode 3]

An embodiment mode of the present invention will be described with reference to FIGS. 2A to 2D. In this embodiment mode, a case where heat treatment is conducted after introduction of an impurity element, thereby controlling an internal stress is described.

Figure 2A:
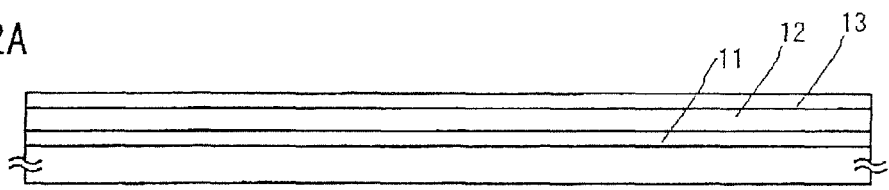
FIGS. 2A to 2D are views showing an example of the concept of the present invention.

First, the steps up through the formation of the insulating film 13 are conducted in accordance with Embodiment Mode 1. Note that FIG. 2A shows the same state as that of FIG. 1A.

Next, a conductive film 17 is formed on the insulating film 13 with a thickness of 250 to 600 nm by using sputtering, plasma CVD or the like. An example of a single layer structure of the conductive film 17 is shown here, but a structure in which two or more layers of the conductive film are laminated may be adopted.

Figure 2B:
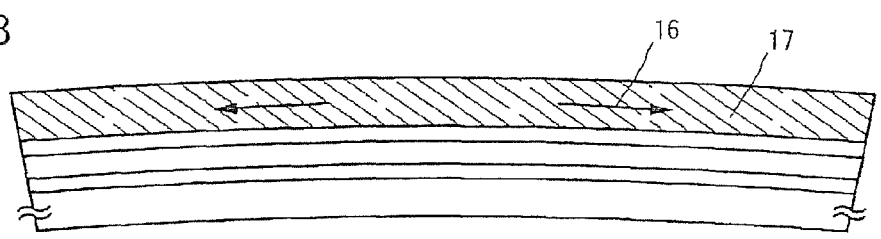
Figure 2C:
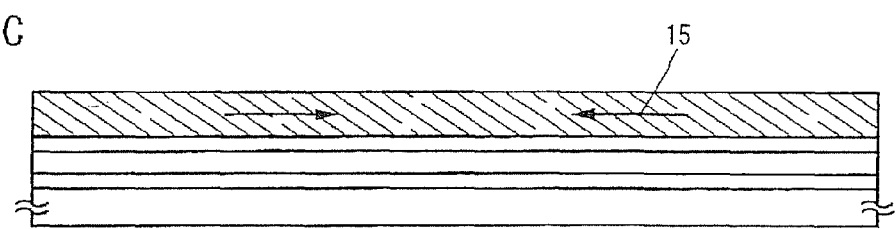
Figure 2D:
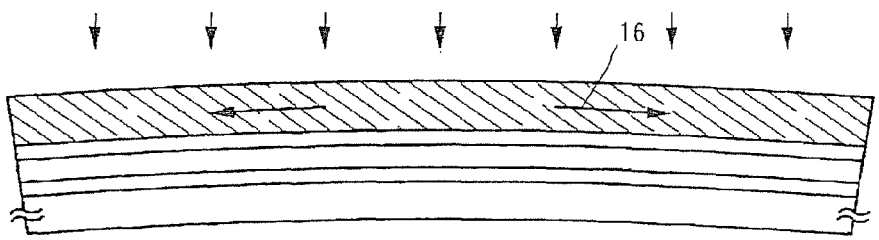

However, there is a case where the conductive film 17 formed by sputtering has a strong compressive stress 15. Therefore, the internal stress in the conductive film 17 is varied by conducting heat treatment. A known method such as thermal annealing using an annealing furnace, RTA or laser annealing may be employed for the heat treatment. (FIG. 2B)

Subsequently, after the heat treatment is conducted, when the internal stress in the conductive film 17 increases if it is a tensile stress while the internal stress is relaxed if it is a compressive stress. (FIG. 2C) The heat treatment may be conducted by employing a known method such as thermal annealing using an annealing furnace, laser annealing or RTA. For example, if thermal annealing using an annealing furnace is conducted, it is sufficient that a substrate is exposed to a nitrogen atmosphere approximately at 500 to 1000° C. for about 3 minutes to 12 hours. Of course, the optimum conditions for the heat treatment differ depending on the state of the conductive film or desired internal stress.

Further, an impurity element is introduced, thereby changing the internal stress. The impurity element introduction may be performed by using plasma doping, ion implantation, ion shower doping or the like. Moreover, as the impurity element for introduction, one or a plurality of elements selected from impurity elements imparting -type conductivity, impurity elements imparting p-type conductivity and rare gas elements are used, and the introduction is performed with an accelerating voltage of 30 to 120 keV, a dose amount of $1 \times 10^{12}$ to $9 \times 10^{16}$/cm$^2$, and a peak concentration of $1 \times 10^{17}$ to $1 \times 10^{22}$/cm$^3$. (FIG. 2D) In addition, the impurity element is introduced after the heat treatment is conducted, whereby the internal stress can be changed with a small dose amount or a low accelerating voltage due to channeling.

The internal stress of the conductive film thus formed is a desired internal stress, and the stress applied to the semiconductor film can be reduced or set to the desired stress. Then, when a TFT is manufactured by using such a conductive film, the electric characteristics thereof become satisfactory, and the operational characteristics of a semiconductor device can be remarkably improved.

More detailed description will be made of the present invention constructed as described above with the following embodiments.

Embodiments

Embodiments of the present invention will be described below. Of course, the present invention is not limited particularly to the embodiments.

[Embodiment 1]

An experiment that has been conducted for showing the effectivity of the present invention will be described. Note that, in this embodiment, W (tungsten) and Ar are used for a conductive film and an impurity element, respectively, but the present invention is not limited particularly to these.

Figure 3:
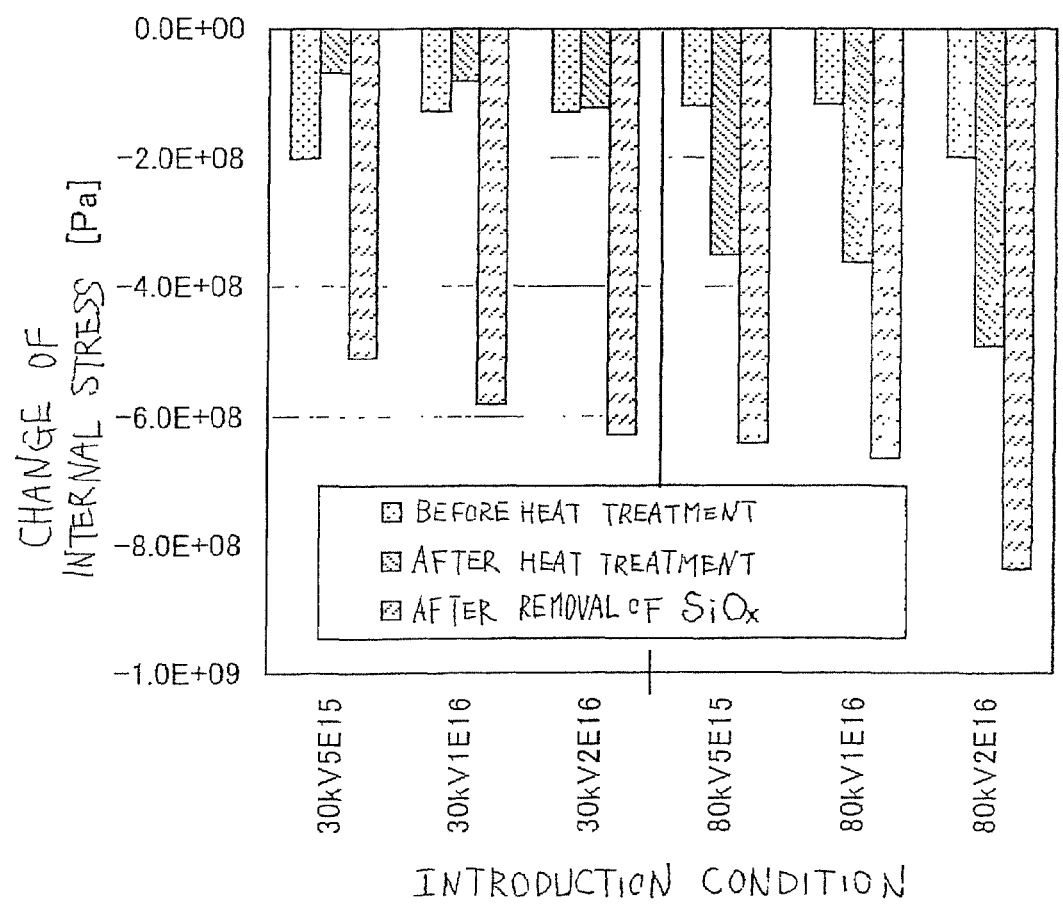
FIG. 3 is a diagram showing an example of a change amount toward a compressive stress due to introduction of an impurity element.

First, W is deposited on a synthetic quartz substrate 10 to have a film thickness of 300 nm by sputtering. Next, after a silicon oxynitride film with a thickness of 70 nm (composition ratio: Si=32.8%, O=63.7%, and H=3.5%) is formed by CVD, heat treatment is performed at 950° C. for 30 minutes. Then, the silicon oxynitride film is removed. The reason the silicon oxynitride film is formed on W is for preventing is peeling of W due to the heat treatment. Introduction of the impurity element is conducted by ion shower doping, and the conditions are shown in Table 1. Further, the introduction of the impurity element is conducted under the three conditions: before the heat treatment: after the heat treatment; and after the removal of the silicon oxynitride film. The results are shown in FIG. 3. Here, when a change of an internal stress is an increase of a tensile stress, "+" is indicated, and when the change of an internal stress is an increase of a compressive stress, "−" is indicated.

| condition | accelerating voltage [keV] | dose [/cm$^2$] |
|---|---|---|
| 1 | 30 | $5 \times 10^{15}$ |
| 2 |  | $1 \times 10^{16}$ |
| 3 |  | $2 \times 10^{16}$ |
| 4 | 80 | $5 \times 10^{15}$ |
| 5 |  | $1 \times 10^{16}$ |
| 6 |  | $2 \times 10^{16}$ |

According to FIG. 3, it can be seen that the internal stress changes toward the to compressive stress in any condition when Ar is introduced. When the impurity element is introduced after the heat treatment, the crystallinity is improved due to the heat treatment. Thus, the impurity element is easily to be introduced into the film to the depths, and the internal stress greatly changes to the compressive stress. However, when Ar is introduced through the silicon oxynitride film, a substantial introduction is amount of Ar with respect to W is small. Thus, the change to the compressive stress is also small.

Figure 4:
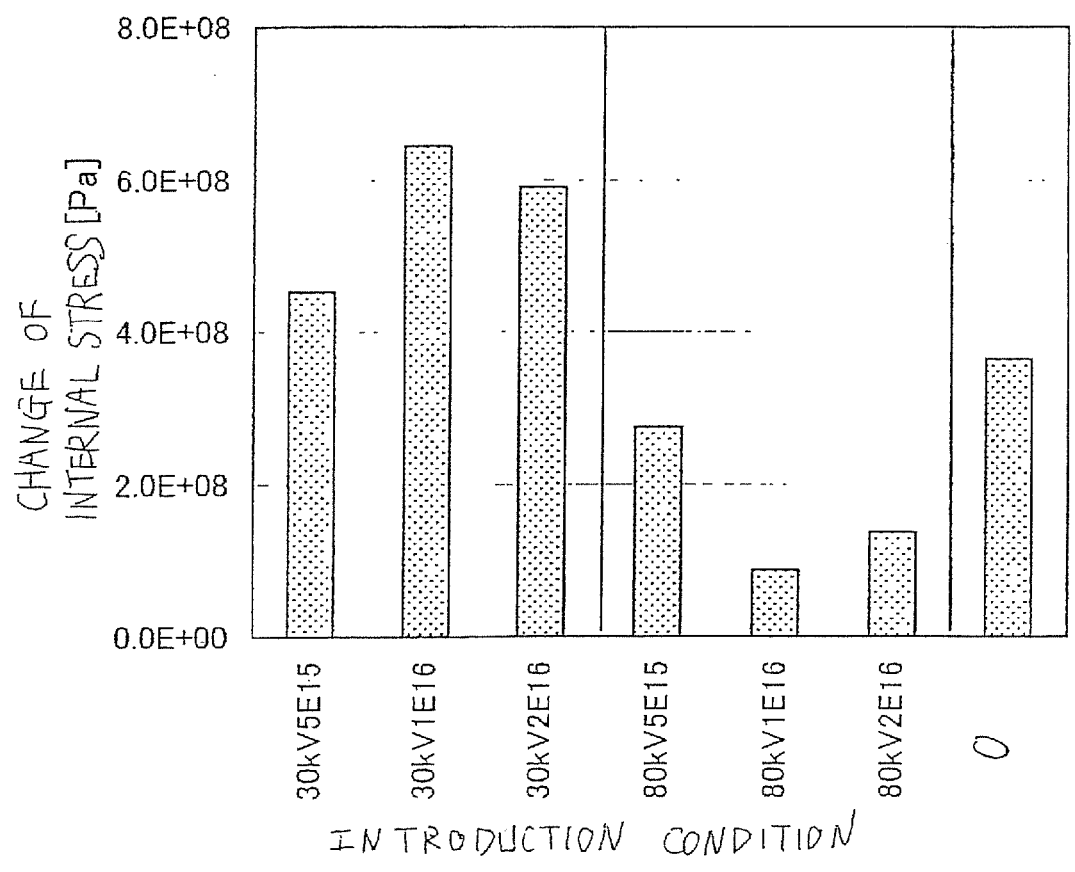
FIG. 4 is a diagram showing an example of a change amount toward a tensile stress due to heat treatment.
Figure 5A:
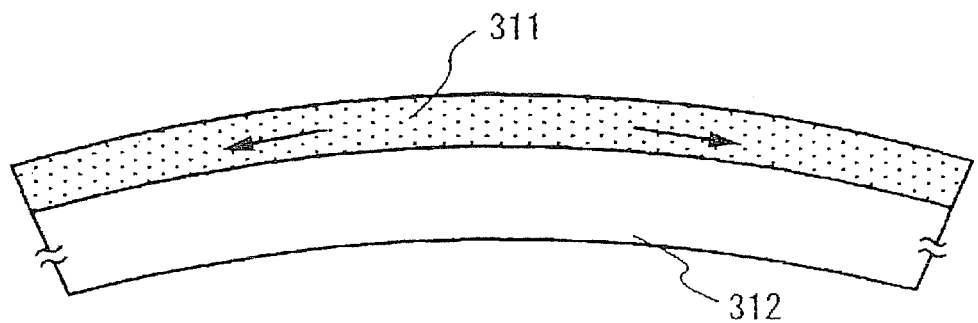
FIGS. 5A and 5B are views for explaining a tensile stress and a compressive stress.
Figure 5B:
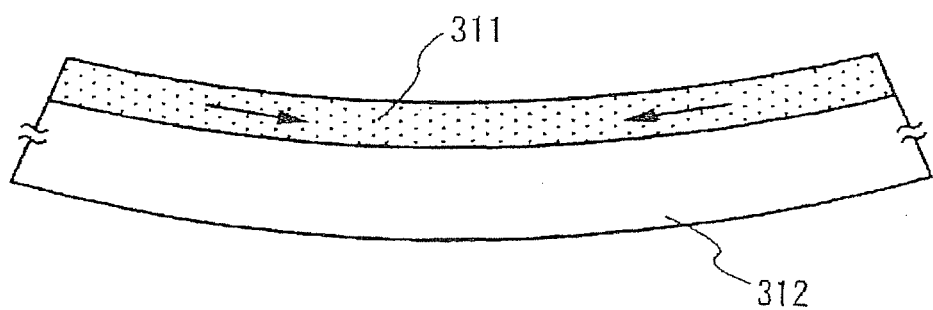

Subsequently, FIG. 4 shows the change of the internal stress before and after the heat treatment in the above experiment. Further, the change of the internal stress was examined also for the case where only the heat treatment is conducted without introduction of the impurity element. According to FIG. 4, at an accelerating voltage of 30 keV, the increase of the tensile stress is larger compared with the case where the impurity element is not introduced. As to this, it is considered that the tensile stress is increased due to the heat treatment since the compressive stress is increased by the introduction of the impurity element. Further, since the change to the tensile stress is small at 80 keV, the impurity element is sufficiently introduced into the film to the depths with a high accelerating voltage. Thus, it is considered that the internal stress is hard to be influenced by the heat treatment.

As described above, it is confirmed that, as to the internal stress, the compressive stress is increased due to the introduction of the impurity element and the tensile stress is increased due to the heat treatment. That is, the introduction of the impurity element, or both the introduction of the impurity element and the heat treatment are conducted, whereby the internal stress can be controlled. Therefore, a conductive film having a desired internal stress can be obtained.

[Embodiment 2]

In this embodiment, a case where the present invention is applied to a gate electrode of a TFT will be explained with reference to FIGS. 6A to 6E.

First, a base insulating film 11 is formed on a substrate 10. As the substrate 10, a glass substrate, a quartz substrate, a single crystal silicon substrate, or a metal or stainless steel substrate having an insulating film on its surface may be used. Also, a plastic substrate having heat resistance that can withstand a process temperature may be used.

Further, the base insulating film 11 comprising an insulating film such as a silicon oxide film, a silicon nitride film or a silicon oxynitride film is formed. An example of a single layer structure of the base insulating film 11 is shown here, but a structure in which two or more layers of the insulating film are laminated may be adopted. Note that the base insulating film 11 may not be formed. In this embodiment, the 150 nm thick silicon oxynitride film 11 (composition ratio: Si=32%, O=27%, N=24%, and H=17%) is formed.

Next, a semiconductor film is formed on the base insulating film 11, and then, etching is performed to obtain semiconductor layers 20 and 21. Here, an n-channel TFT is formed by using the semiconductor layer 20 while a p-channel TFT is formed by using the semiconductor layer 21. As to the semiconductor film, a semiconductor film having an amorphous structure is deposited by a known means (sputtering, LPCVD, plasma CVD or the like) and then, a known crystallization process (laser crystallization, thermal crystallization, thermal crystallization using a catalyst such as nickel, or the like) is conducted thereto, thereby forming a crystalline semiconductor film. The semiconductor film 12 is formed to have a thickness of 25 to 200 nm (preferably 30 to 100 nm). There is no limitation on a material for the semiconductor film, but the semiconductor film is preferably formed from silicon or an alloy of silicon germanium (SiGe). In this embodiment, a semiconductor film having a crystalline structure is formed by laser light irradiation, and then patterning is conducted thereto, thereby forming the semiconductor layers 20 and 21.

Then, an insulating film 22 that covers the semiconductor layers 20, 21 is formed. The insulating film 22 comprises a single layer or a lamination structure of an insulating film preferably containing silicon with a thickness of 40 to 150 nm by using plasma CVD or sputtering. Note that the insulating film 22 becomes a gate insulating film. In this embodiment, a silicon oxynitride film (composition ratio: Si=32%, O=59%, N=7%, and H=2%) with a thickness of 110 nm is formed by plasma CVD.

Subsequently, a conductive film 23 with a thickness of 250 to 600 nm is formed on the insulating film 22 by using sputtering, plasma CVD or the like. (FIG. 6A) An example of a single layer structure of the conductive film 23 is shown here, but a structure in which two or more layers of the conductive film 23 are laminated may be adopted. Also, the conductive film may be formed from an element selected from the group consisting of Ta, W, Ti, Mo, Al, Cu, Cr and Nd, or an alloy material or compound material containing the element as its main constituent. A semiconductor film typified by a polycrystalline silicon film introduced with an impurity element such as phosphorous may also be used. Further, an AgPdCu alloy may also be used. In this embodiment, a 400 nm thick Ta film is formed by sputtering. In addition, the film formed by sputtering often has a compressive stress.

Figure 6A:
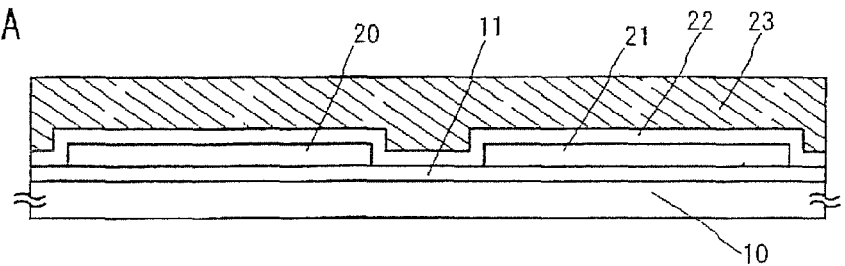
FIGS. 6A to 6E are views showing an example of the concept of the present invention.
Figure 6B:
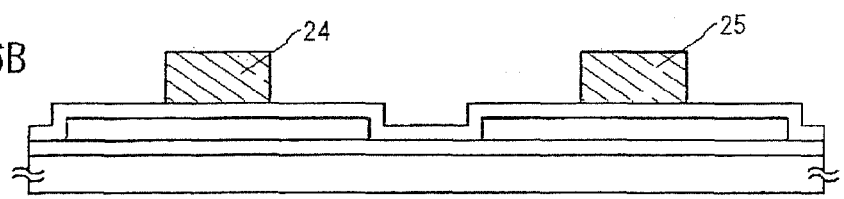
Figure 6C:
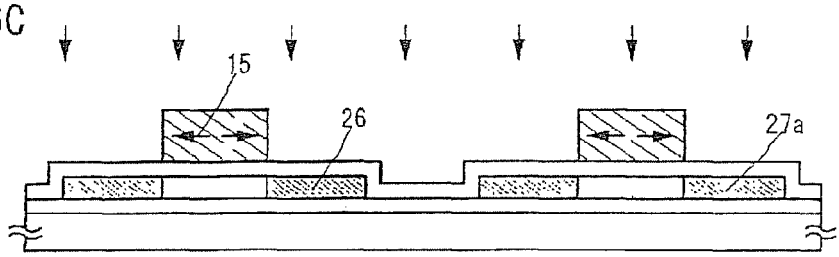
Figure 6D:
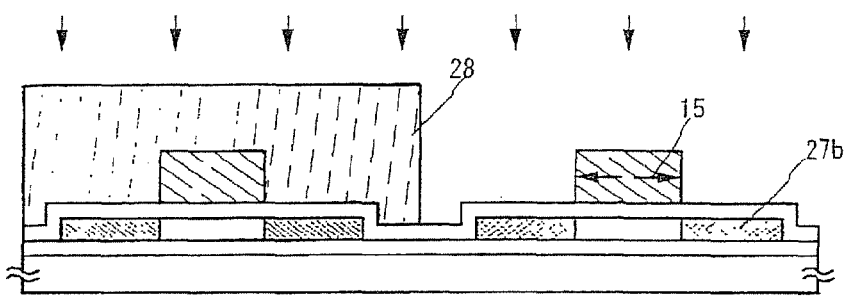
Figure 6E:
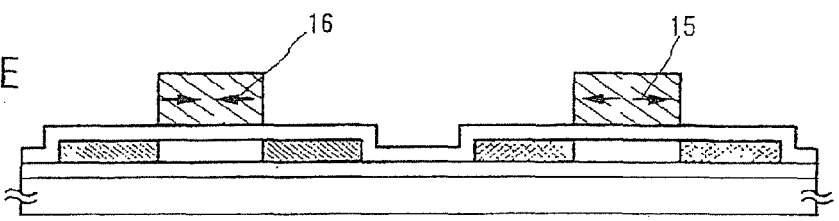

Next, the conductive film 23 is subjected to an etching process by a patterning process using photolithography, thereby forming a first conductive film 24 and a second conductive film 25. (FIG. 6B)

Then, a first impurity element is introduced to form impurity regions 26, 27a in the semiconductor layers 20, 21, respectively. (FIG. 6C) The introduction of an impurity element may be conducted by plasma doping, ion implantation, ion shower doping or the like. In this embodiment, As is used as an impurity element imparting n-type conductivity. Further, the introduction amount in the introduction of the first impurity element is made larger than the introduction amount of the impurity element in the introduction of a second impurity element. The introduction of the first impurity element is conducted, whereby the impurity region 26 for functioning as an n-channel TFT is formed. At this time, as is also introduced into the first conductive film 24 and the second conductive film 25, and thus, a compressive stress 15 increases.

Subsequently, the introduction of the second impurity element is conducted to form an impurity region 27b in the semiconductor layer 21. (FIG. 6D) At this time, since the semiconductor layer 20 forming the n-channel TFT is covered by a mask 28 formed of resist, the impurity element is not introduced thereinto. In this embodiment, B (boron) is used as an impurity element imparting p-type conductivity. The introduction of the second impurity element is conducted, whereby the impurity region 27b for functioning as a p-channel TFT is formed. B is also introduced into the second conductive film 25, and thus, the compressive stress 15 in the second conductive film 25 further increases.

As described above, the impurity regions are formed. In addition, a larger amount of the impurity element is introduced into the second conductive film 25 in comparison with the first conductive film 24.

Next, when heat treatment is conducted, recovery of crystallinity of the semiconductor film and activation of the impurity element are carried out. (FIG. 6E) Further, due to the heat treatment, the internal stresses in the first conductive film 24 and in the second conductive film 25 are varied. However, since the amount of the impurity element introduced into the first conductive film 24 is different from that introduced into the second conductive film 25, the internal stress after the heat is treatment also differs between both the conductive films. Since the introduction amount of the impurity element to the first conductive film 24 is small, the internal stress varies greatly in a direction 16 in which a tensile stress increases due to the heat treatment, and thus, the internal stress in the first conductive film 24 becomes a tensile stress. Therefore, the stress that the semiconductor film forming the n-channel TFT receives becomes the tensile stress. Further, since the introduction amount of the impurity element is large in the second conductive film 25, the internal stress does not vary much due to the heat treatment, and thus, the internal stress in the second conductive film 25 becomes the compressive stress 15. Therefore, the stress that the semiconductor film forming the p-channel TFT receives becomes the compressive stress 15.

As described above, the internal stresses of the respective conductive films are controlled, whereby the stress applied to the semiconductor film forming the n-channel TFT is made to be the tensile stress, and the stress applied to the semiconductor film forming the p-channel TFT is made to be the compressive stress. Further, the stress that the semiconductor film forming the p-channel TFT receives can be relatively made closer to the tensile stress in comparison with the stress that the semiconductor film forming the n-channel TFT receives. This embodiment is very effective in the case where a gate insulating film is made thinner along with the miniaturization of a transistor, whereby a stress applied to an active layer becomes conspicuous. Then, when a TFT is manufactured by using such a semiconductor film, the electric characteristics thereof become satisfactory, and the operational characteristics of a semiconductor device can be greatly enhanced.

[Embodiment 3]

Figure 7A:
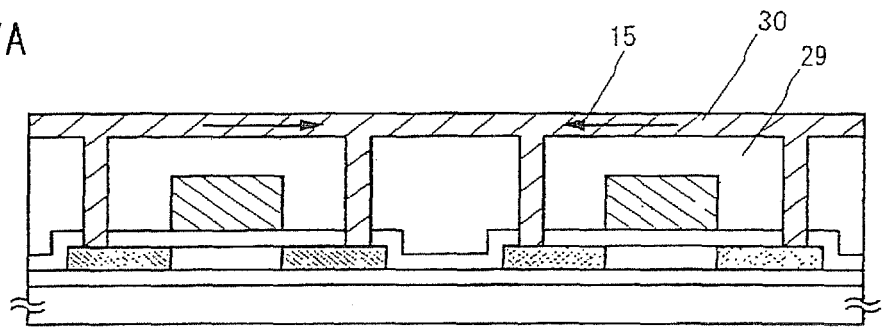
FIGS. 7A to 7C are views showing an example of the concept of the present invention.
Figure 7B:
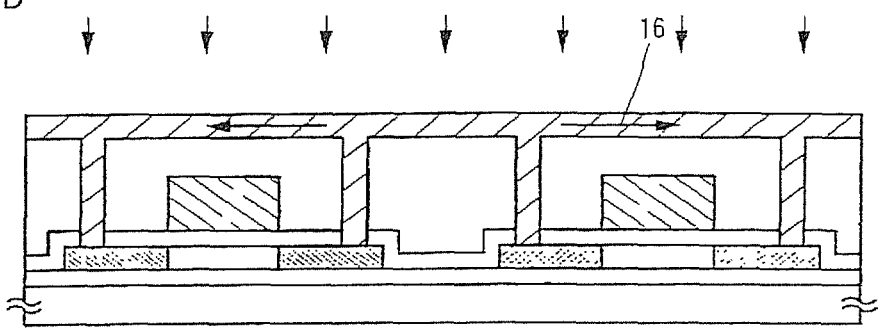
Figure 7C:
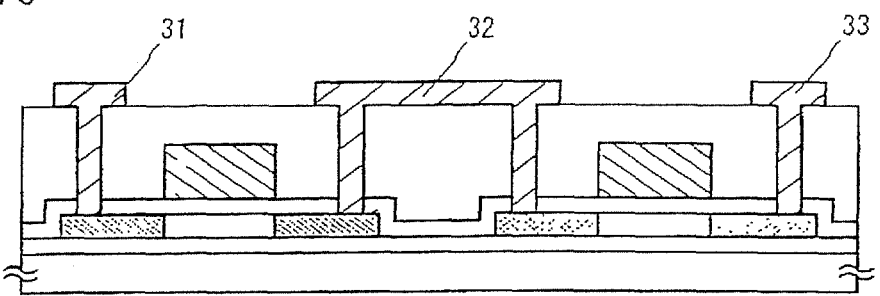
Figure 8A:
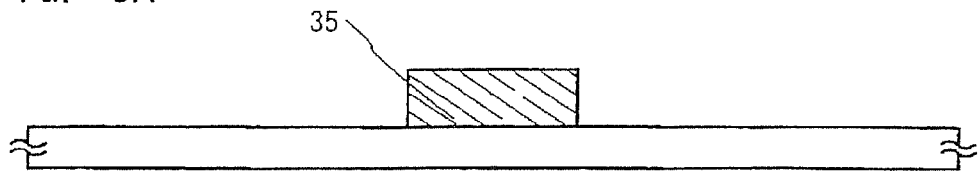
FIGS. 8A to 8D are sectional views showing a manufacturing process of a pixel TFT and a driver circuit TFT.
Figure 8B:
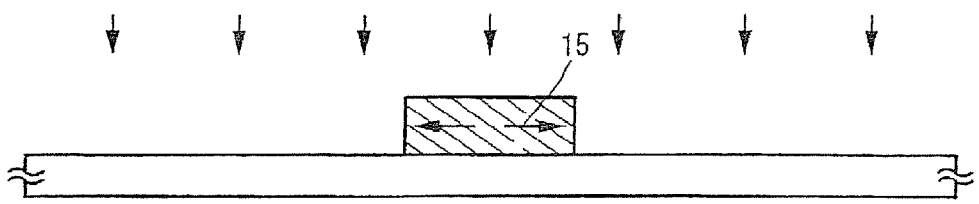
Figure 8C:
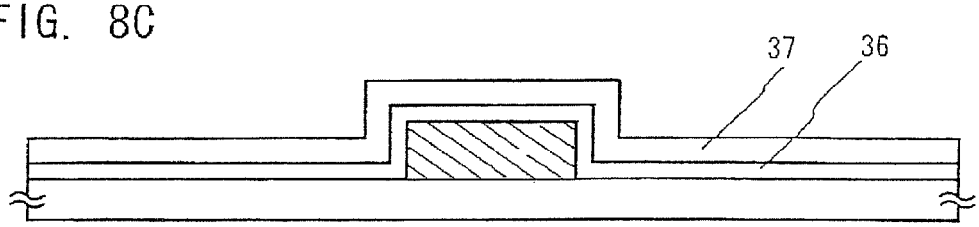
Figure 8D:
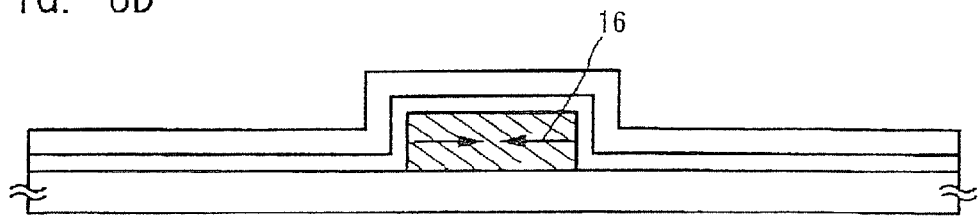

In this embodiment, a case where the present invention is applied to a wiring of a TFT will be described with reference to FIGS. 7A to 7C.

A base insulating film is formed on a substrate, semiconductor layers are formed on the base insulating film, an insulating film is formed so as to cover the semiconductor layers, and conductive layers are formed on the semiconductor layers through the insulating film. Thereafter, an impurity element is introduced into the semiconductor layers with the conductive layers as masks. Further, the method shown in Embodiment 2 may be adopted.

Subsequently, an interlayer insulating film 29 formed from an inorganic insulating film material or an organic insulator material is formed. In this embodiment, a single layer structure of the interlayer insulating film 29 is adopted, but a structure in which two or more layers of the insulating film are laminated may be adopted.

Then, a conductive film electrically connected to respective impurity regions is formed. (FIG. 7A) There is a case where the conductive film has a strong tensile stress. Therefore, an impurity element is introduced, whereby an internal stress of the conductive film is changed such that a compressive stress increases. (FIG. 7B) The internal stress is controlled by the above method, and the conductive film having an internal stress of ±1 GPa or less can be formed. Therefore, a wiring pattern is prevented from deviating when patterning is conducted to form wirings 31 to 33. (FIG. 7C)

Further, the internal stress of the conductive layer thus formed is ±1 GPa or less, and it becomes possible to reduce the stress applied to the interlayer insulating film and the semiconductor films. Then, when a TFT is manufactured by using such a conductive layers, the electric characteristics thereof become satisfactory, and the is operational characteristics of a semiconductor device can be remarkably improved.

[Embodiment 4]

In this embodiment, a case where the present invention is applied to a gate electrode of a TFT having a structure different from that in Embodiment 2 will be described with reference to FIGS. 8A to 8D.

First, a conductive film 35 is formed on a substrate 10. As the substrate 10, a glass substrate, a quartz substrate, a single crystal silicon substrate, or a metal or stainless steel substrate having an insulating film on its surface may be used. Also, a plastic substrate having heat resistance that can withstand a process temperature may be used.

Further, the conductive film 35 is formed such that a conductive film 20 having a thickness of 250 to 600 nm is formed by using sputtering, plasma CVD or the like, and then, patterning is conducted thereto by using photolithography. (FIG. 8A) An example of a single layer structure of the conductive film 35 is shown here, but a structure in which two or more layers of the conductive film 35 are laminated may be adopted. Also, the conductive film may be formed from an element selected from the group consisting of Ta, W, Ti, Mo, Al, Cu, Cr and Nd, or an alloy material or compound material containing the element as its main constituent. A semiconductor film typified by a polycrystalline silicon film introduced with an impurity element such as phosphorous may also be used. Further, an AgPdCu alloy may also be used. In this embodiment, a 400 nm thick Al—Ti film is formed by sputtering.

Subsequently, an impurity element is introduced, whereby an internal stress of the conductive film is changed in a direction 15 that a compressive stress increases. (FIG. 8B) This is a process which is conducted in advance for relaxing the internal stress since the internal stress of the conductive film is changed such that a tensile stress increases due to heat treatment in the subsequent step.

Further, in a case where the semiconductor film in which an impurity element such as phosphorous is introduced is used as the conductive film 35, a semiconductor film is formed on the substrate 10, patterning is conducted thereto, and the impurity element such as phosphorous is introduced, whereby it can be relaxed in advance that the internal stress is changed in a direction that the tensile stress increases due to the heat treatment in the subsequent step.

Then, an insulating film 36 covering the conductive film 35 is formed. The insulating film 36 comprises a single layer or a lamination structure of an insulating film preferably containing silicon to have a thickness of 40 to 150 nm by using plasma 25. CVD or sputtering. Note that the insulating film 36 becomes a gate insulating film. In this embodiment, a 110 nm thick silicon oxynitride film (composition ratio: Si=32%, O=59%, N=7%, and H=2%) is formed by plasma CVD.

Next, a semiconductor film 37 is formed on the insulating film 36. As to the semiconductor film 37, a semiconductor film having an amorphous structure is deposited by a known means (sputtering, LPCVD, plasma CVD or the like) and then, a known crystallization process (laser crystallization, thermal crystallization, thermal crystallization using a catalyst such as nickel, or the like) is conducted thereto, thereby forming a crystalline semiconductor film. The semiconductor film 37 is formed to have a thickness of 25 to 200 nm (preferably 30 to 100 nm). There is no limitation on a material for the semiconductor film, but the semiconductor film is preferably formed from silicon or an alloy of silicon germanium (SiGe). In this embodiment, after an amorphous silicon film is deposited with a thickness of 55 nm by using plasma CVD, a solution containing nickel is applied onto the amorphous silicon film. Dehydrogenation (500° C., 1 hour) is performed to the amorphous silicon film, and then, thermal crystallization (550° C., 4 hours) is performed. The semiconductor film 37 becomes a semiconductor film having a crystalline structure due to the heat treatment. Further, since the impurity element has been introduced into the conductive film 35 in advance, the change amount of the internal stress in the conductive film 35 is small.

The internal stress in the conductive film thus formed is a desired internal stress, and the stress applied to the semiconductor film can be reduced or set to the desired stress. Then, when a TFT is manufactured by using such a conductive film, the electric characteristics thereof become satisfactory, and the operational characteristics of a semiconductor device can be remarkably improved.

[Embodiment 5]

In this embodiment, a case where the present invention is applied to an insulated gate field effect transistor (MOSFET or IGFET) to constitute a CMOS circuit will be described with reference to FIGS. 21A to 23.

First, a single crystal silicon substrate 401 is prepared, and an impurity element is implanted to form a P-type well 402 and an N-type well 403. The single crystal silicon substrate may be a P-type or N-type. This structure is a so-called twin tub structure, and is formed with a well concentration of $1\times10^{18}/cm^3$ or less (typically $1\times10^{16}$ to $5\times10^{17}/cm^3$)

Figure 21A:
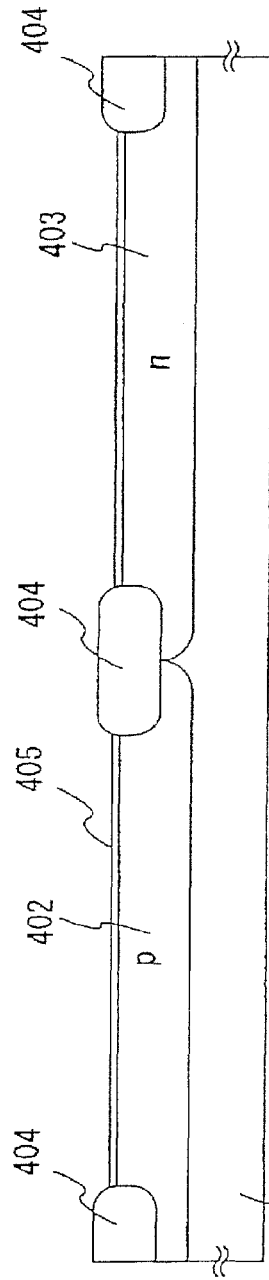
FIGS. 21A to 21C are sectional views showing a manufacturing process of a MOSFET.
Figure 21B:
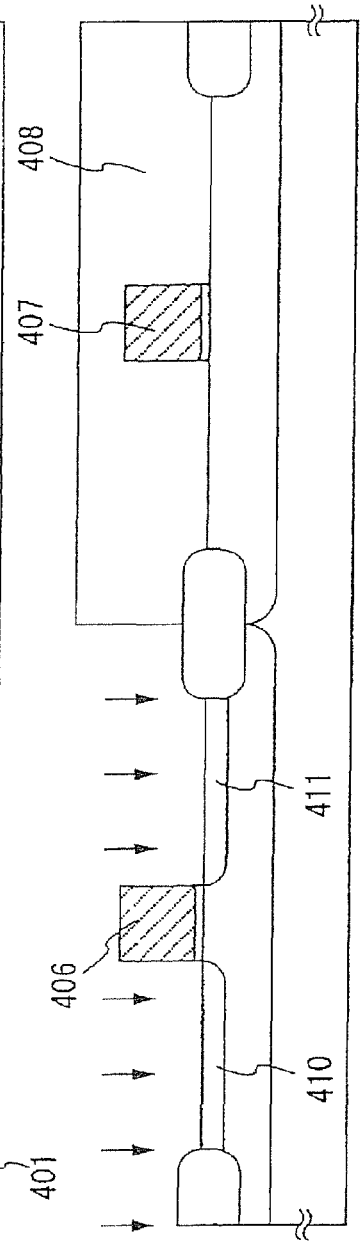

Next, selective oxidization is conducted by using a known LOCOS method or the like. After a field oxide film 404 is formed, a 30 nm thick oxide film (gate insulating film in the later step) 405 is formed on a silicon surface by a thermal oxidization process. (FIG. 21A)

Next, a first gate electrode 406 and a second gate electrode 407 are formed. In is this embodiment, a silicon film having conductivity is used as a material for forming the gate electrodes. However, in addition, an element selected from the group consisting of Ta, W, Ti, Mo, Al, Cu, Cr and Nd, or an alloy material or compound material containing the element as its main constituent can be used.

After the formation of the first gate electrode 406 and the second gate electrode 407, a region that becomes a p-channel MOSFET (on the right side of the figure) is covered with a resist mask 408, and an impurity element imparting n-type conductivity is introduced into the single crystal silicon substrate 401. (FIG. 21B) Any of laser doping, plasma doping, ion implantation and ion shower doping is used as a method of introducing an impurity element, and the introduction is conducted so as to attain a concentration of $5 \times 10^{18}$ to $1 \times 10^{19}/\text{cm}^3$. In this embodiment. As is used as the impurity element imparting n-type conductivity. Parts of impurity regions 410 and 411 thus formed (end portions on the side that contacts a channel forming region) function as LDD regions of an n-channel MOSFET later.

Next, a region that becomes the channel MOSFET is covered with a resist mask 412. Then, an impurity element imparting p-type conductivity is introduced into the single crystal silicon substrate 401. (FIG. 21C) In this embodiment, B (boron) is used as the impurity element imparting p-type conductivity. In this way, impurity regions 414 and 415 that function as LDD regions of the p-channel MOSFET later are formed.

Figure 21C:
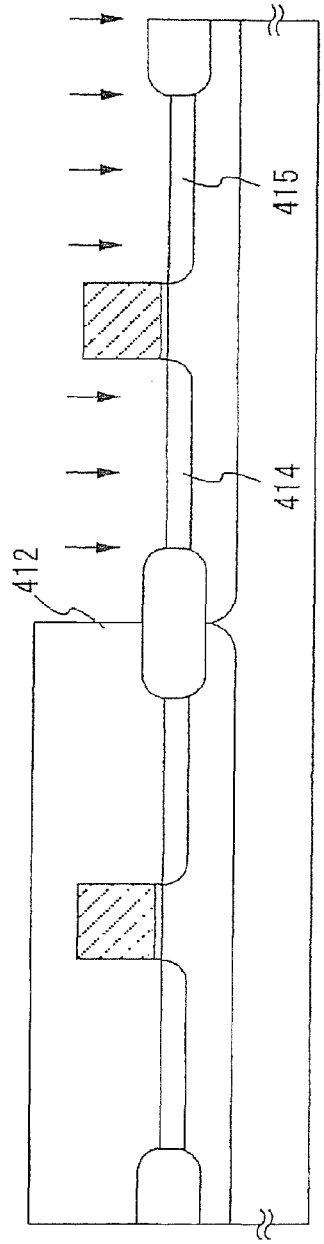
Figure 22A:
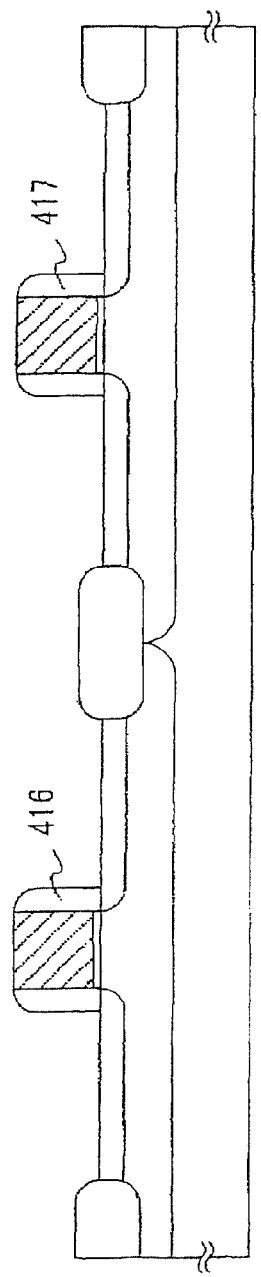
FIGS. 22A to 22C are sectional views showing the manufacturing process of a MOSFET.

After the state of FIG. 21C is obtained, then, a silicon oxide film (not shown) is deposited, and etchback is conducted, thereby forming side walls 416 and 417. (FIG. 22A)

Figure 22B:
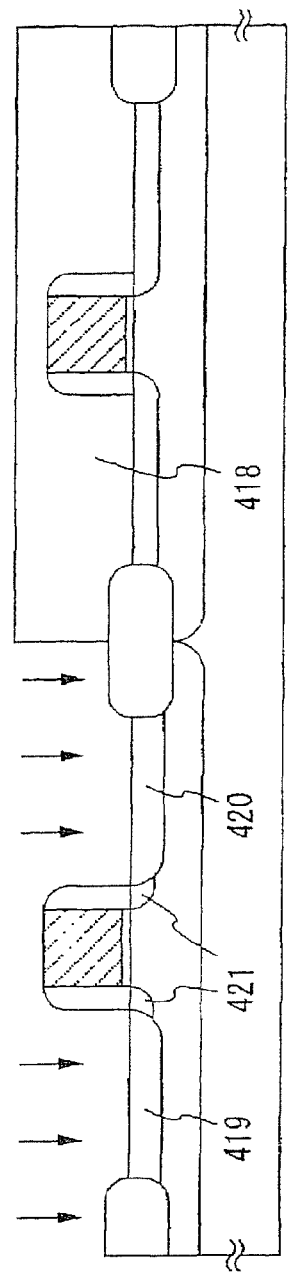

Next, the region that becomes the p-channel MOSFET is covered with a resist mask 418 again, and an impurity element imparting n-type conductivity is introduced 51 with a concentration of $1 \times 10^{20}/\text{cm}^3$. Thus, a source region 419 and a drain region 420 are formed, and an LDD region 421 is formed under the side wall 416. (FIG. 22B)

Similarly, the region that becomes the n-channel MOSFET is covered with a resist mask 422, and an impurity element imparting p-type conductivity is introduced with a concentration of $1 \times 10^{20}/\text{cm}^3$. Thus, a drain region 423 and a source region 424 are formed, and an LDD region 425 is formed under the side wall 417. (FIG. 22C) Further, while the region is covered with the resist mask 422, one or a plurality of elements selected from rare gas elements are introduced. In this way, a larger amount of the impurity element is introduced into the second gate electrode 407 compared with the first gate electrode 406. Thus, the compressive stress in the second gate electrode 407 is stronger than that in the first gate electrode 406, and also, the compressive stress that the channel forming region in the p-channel MOSFET receives is stronger than the compressive stress that the channel forming region in the n-channel MOSFET receives.

Figure 22C:
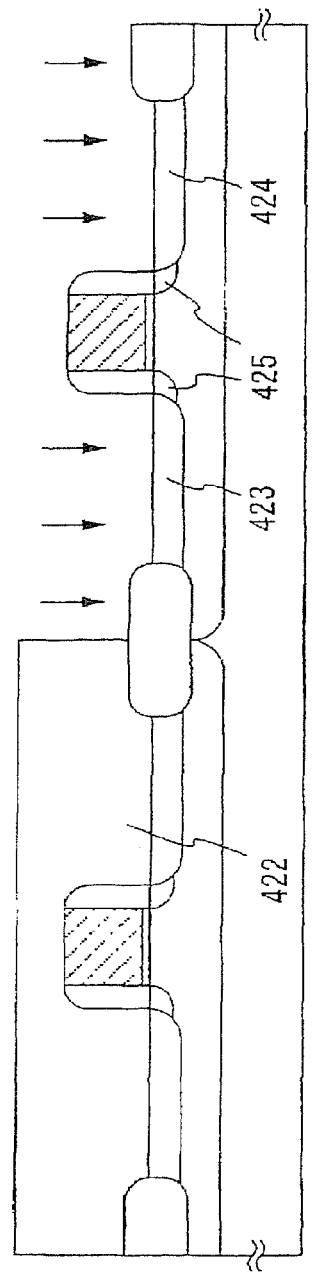

After the state of FIG. 22C is obtained, first heat treatment is conducted to perform activation of the introduced impurity element.

Subsequently, a titanium film is formed, and second heat treatment is conducted, thereby forming a titanium silicide layer 426 on the source region, the drain region, and the surface of the gate electrode. Of course, metal silicide using other metal film can be formed. After the silicide layer is formed, the titanium film is removed.

Due to the first heat treatment and the second heat treatment, the internal stresses of the first gate electrode 406 and of the second gate electrode 407 are varied. However, the second gate electrode 407 has a larger introduction amount of the impurity element in comparison with the first gate electrode 406, and thus, has a small change of the internal stress. Therefore, the compressive stress of the second gate electrode 407 is stronger than that of the first gate electrode 406, and also, the compressive stress that the channel forming region in the p-channel MOSFET receives is stronger than the compressive stress that the channel forming region in the n-channel MOSFET receives.

Next, an interlayer insulating film 427 is formed. Contact holes are opened to form source electrodes 428 and 429 and a drain electrode 430. Of course, it is also effective that hydrogenation is conducted after the formation of the electrodes.

Figure 23:
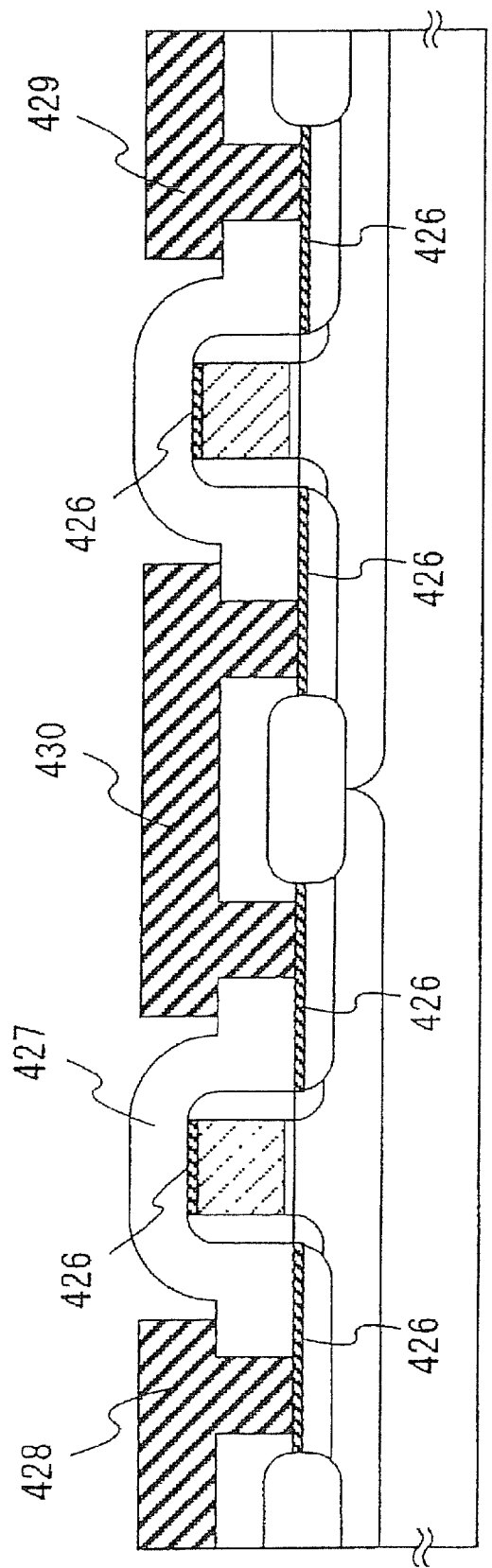
FIG. 23 is a sectional view showing the manufacturing process of a MOSFET.

By conducting the above-described steps, the CMOS circuit as shown in FIG. 23 can be obtained. The electric characteristics of the CMOS circuit in which the internal stress of the gate electrode is controlled become satisfactory, and the operational characteristics of a semiconductor device can be remarkably improved.

[Embodiment 6]

In this embodiment, a method of manufacturing an active matrix substrate will be described with reference to FIGS. 9A to 14B. In this specification, a substrate in which a CMOS circuit, a driver circuit, and a pixel portion having a pixel TFT and a storage capacitor are formed on the same substrate is called an active matrix substrate for the convenience of description.

First, in this embodiment, a substrate 501 made of glass such as barium borosilicate glass or alumino borosilicate glass, typified by #7059 glass or #1737 glass of Corning, Inc. is used. Note that a quartz substrate, a single crystal silicon substrate, a metal or stainless steel substrate having an insulating film on its surface may also be used as the substrate 501. Also, a plastic substrate having heat resistance that can withstand a process temperature in this embodiment may be used. A flexible substrate may also be used. In this embodiment, a synthetic quartz glass substrate is used.

Next, a base film 502 is formed on the quartz substrate 501, and a lower light shielding film 503 is formed on the base film 502. First, a base film with a thickness of 10 to 150 nm (preferably 50 to 100 nm) is formed of an insulating film such, as a silicon oxide film, a silicon nitride film or a silicon oxynitride film. Then, a lower light shielding film with a thickness of approximately 300 nm is formed from a conductive material, which withstands the process temperature in this embodiment, such as Ta, W, Cr or Mo, or a lamination structure thereof. The lower light shielding film also has a function of a gate wiring. In this embodiment, a crystalline silicon film having a thickness of 75 nm is formed, WSix (x=2.0 to 2.8) with a film thickness of 150 nm is subsequently deposited, and then, unnecessary portions are subjected to etching, thereby forming the lower light shielding film 503. Note that, in this embodiment, a single layer structure of the lower light shielding film 503 is adopted, but a lamination structure thereof may also be adopted. In the base film 502 as well, a structure may be taken in which two or more layers of the insulating film are laminated.

A base film 504 with a thickness of 10 to 650 nm (preferably 50 to 600 nm) which comprises an insulating film such as a silicon oxide film, a silicon nitride film or a silicon oxynitride film is formed on the substrate 501 and the lower light shielding film 503. In this embodiment, a single layer structure is taken for the base film 504, but a structure in which two or more layers of the insulating film are laminated may also be adopted. In this embodiment, as the base film 504, the silicon oxynitride film (composition ratio: Si=32%. O=27%, N=24%, and H=17%) having a thickness of 580 nm is formed at 350° C. by using as a reaction gas $SiH_4$, $NH_3$ and $N_2O$ with plasma CVD.

Next, a semiconductor film 505 is formed on the base film 504. As the semiconductor film 505, a semiconductor film having an amorphous structure is formed by a known means (sputtering, LPCVD, plasma CVD or the like) to have a thickness of 25 to 80 nm (preferably 30 to 60 nm). There is no limitation on a material for the semiconductor film, but the semiconductor film is preferably formed from silicon, silicon carbide or an alloy of silicon germanium (SiGe). (FIG. 9A)

Then, the semiconductor film is crystallized by conducting thermal crystallization using a catalyst such as nickel. (FIG. 9B) Further, besides the thermal crystallization using a catalyst such as nickel, known crystallization processes (laser crystallization, thermal crystallization or the like) may be conducted in combination therewith. In this embodiment, a nickel acetate solution (concentration in terms of weight: 10 ppm, volume: 5 ml) is applied onto the entire surface of the semiconductor film 505 by spin coating to form a metal containing layer 405, and the entire substrate is exposed to a nitrogen atmosphere at 600° C. for 12 hours.

Further, in a case where laser crystallization is also applied, it is desirable to use a solid laser, gas laser or metal laser of pulse oscillation or continuous emission type. Note that examples of the solid laser include a YAG laser, $YVO_4$ laser, YLF laser, $YAlO_3$ laser, glass laser, ruby laser, alexandrite laser, Ti:sapphire laser and the like of pulse oscillation or continuous emission type. Examples of the gas laser include an excimer laser, Ar laser, Kr laser, $CO_2$ laser and the like of pulse oscillation or continuous emission type. As the metal lasers, a helium cadmium laser, copper vapor laser, gold vapor laser and the like of pulse oscillation or continuous emission type can be given. In a case where the above laser is used, it is preferable to employ a method in which a laser beam emitted from a laser oscillator is condensed into a linear shape by an optical system to be irradiated to a semiconductor film. The crystallization conditions are appropriately selected by an operator. However, in case of using the excimer laser, a pulse oscillation frequency is set to 300 Hz, and a laser energy density is set to 100 to 1500 $mJ/cm^2$, preferably 100 to 800 $mJ/cm^2$ (typically 200 to 700 $mJ/cm^2$). Further, in case of using the YAG laser, it is preferable that a pulse oscillation frequency is set to 1 to 300 Hz by using the second harmonic and that a laser energy density is set to 250 to 1500 $mJ/cm^2$, preferably 300 to 1000 $mJ/cm^2$ (typically 350 to 800 $mJ/cm^2$). Then, a laser beam condensed into a linear shape with a width of 100 to 1000 μm, for example, 400 μm is irradiated to the entire substrate, and the irradiation may be conducted with an overlap ratio of the linear laser beam at this time of 50 to 98%. Further, in case of using the continuous emission type laser, an energy density of approximately 0.01 to 100 $MW/cm^2$ (preferably 0.1 to 10 $MW/cm^2$) is required. Then, a stage is moved relatively to laser light at a speed of approximately 0.5 to 2000 cm/s for irradiation, thereby forming a crystalline semiconductor film.

Of course, a TFT can be manufactured by using the first crystalline semiconductor film obtained by performing thermal crystallization using a catalyst such as nickel. However, the second crystalline semiconductor film obtained by performing laser crystallization is preferable in the point that the electric characteristics of a TFT are improved since the crystallinity of the second crystalline to semiconductor film is improved. For example, if an n-channel TFT is manufactured by using the first crystalline semiconductor film, the mobility is approximately 300 $cm^2/Vs$. On the other hand, if an n-channel TFT is manufactured by using the second crystalline semiconductor film, the mobility is remarkably improved to approximately 500 to 600 $cm^2/Vs$.

Subsequently, gettering is performed in order to remove or reduce a metal element used for promoting crystallization from a semiconductor layer that becomes an active region. (FIG. 9C) A method disclosed in Japanese Patent Application Laid-open No. Hei 10-270363 may be applied for gettering. In this embodiment, a silicon oxide film with a thickness of 50 nm is formed as a mask, and patterning is conducted, thereby obtaining silicon oxide films 506a to 506d having a desired shape. Then, an element belonging to Group 15 (typically P (phosphorous)) is selectively introduced into the semiconductor film, and heat treatment is conducted, whereby the metal element can be removed from the semiconductor layer, or reduced to such an extent that the metal element does not affect the semiconductor characteristics in the semiconductor layer. In the thus manufactured TFT having the active region, an off current value is lowered, and crystallinity is satisfactory. Thus, high field effect mobility can be obtained, and satisfactory characteristics can be attained.

Then, etching is performed to the crystalline semiconductor film to form semiconductor layers 507a to 510a. (FIG. 9D)

Next, the masks 506a to 506d are removed, an insulating film 511a is newly formed, and heat treatment is conducted for improvement of the crystallinity of the semiconductor film to desirably thermal-oxidize upper portions of the semiconductor layers. In this embodiment, after a 20 nm thick silicon oxide film is formed by means of a low pressure CVD apparatus, heat treatment is performed in an annealing furnace. By conducting this process, the upper portions of the semiconductor layers 507a to 510a are oxidized. Then, the insulating film 511a and the oxidized portions of the semiconductor layers are etched, thereby obtaining semiconductor layers 507b to 510b in which crystallinity is improved.

After the formation of the semiconductor layers 507b to 510b, a minute amount is of impurity element (boron or phosphorous) may be introduced in order to control a threshold value of a TFT.

Next, a first gate insulating film 511b covering the semiconductor layers 507b to 510b is formed. (FIG. 10A) The first gate insulating film 511b is formed of an insulating film containing silicon to have a thickness of 20 to 150 nm by using plasma CVD or sputtering. In this embodiment, a silicon oxynitride film (composition ratio: Si=32%, O=59%, N=7%, and H=2%) with a thickness of 35 nm is formed by plasma CVD. Of course, the gate insulating film is not limited to the silicon oxynitride film, and other insulating films containing silicon may be used.

Further, in case of using a silicon oxide film, TEOS (tetraethyl orthosilicate) and $O_2$ are mixed by plasma CVD, a reaction pressure of 40 Pa and a substrate temperature of 300 to 400° C. are set, and discharge is caused with a high frequency (13.56 MHz) power density of 0.5 to 0.8 $W/cm^2$, thereby forming the silicon oxide film. The silicon oxide film thus manufactured can obtain satisfactory characteristics as a gate insulating film due to subsequent thermal annealing at 400 to 500° C.

Then, the gate insulating film is partially etched to make a semiconductor layer 510b, which becomes one of electrodes of the storage capacitor, be exposed, and an impurity element is introduced into the semiconductor layer 510b. (FIG. 10B) At this time, a resist 513 is formed in other region so that the impurity element is not introduced thereinto. In this embodiment, P (phosphorous) is used as the impurity element, and the impurity element is introduced with an accelerating voltage of 10 keV and a dose amount of $5\times10^{14}/cm^2$.

Subsequently, a second gate insulating film 512 is formed. The second gate insulating film 512 is formed of an insulating film containing silicon to have a thickness of 20 to 150 nm by using plasma CVD or sputtering. In this embodiment, is a 50 nm thick silicon oxynitride film (composition ratio: Si=32%, O=59%. N=7%, and H=2%) is formed by plasma CVD. Of course, the gate insulating film is not limited to the silicon oxynitride film, and other insulating films containing silicon may also be used.

After a contact connecting with the lower light shielding film is formed, a first conductive film 515 with a thickness of 20 to 100 nm and a second conductive film 516a with a thickness of 100 to 400 nm are formed into lamination. (FIG. 10C) In this embodiment, the first conductive film 515 comprising a 30 nm thick TaN film and the second conductive film 516a comprising a 370 nm thick W film are formed into lamination. The TaN film is formed by sputtering, and the sputtering is conducted in an atmosphere containing nitrogen with Ta as a target. Further, the W film is formed by sputtering with W as a target. Moreover, the W film can be formed by thermal CVD using tungsten hexafluoride ($WF_6$). In any case, it is necessary to lower the resistance in order to use the W film as a gate electrode, and it is desirable that the resistivity of the W film is lowered to 20 $\mu\Omega$cm or less.

Note that, the first conductive film 515 and the second conductive film 516a are formed from TaN and W, respectively, in this embodiment, but are not particularly limited. Both the conductive films may be formed from an element selected from the group consisting of Ta, W, Ti, Mo, Al, Cu, Cr and Nd or an alloy material or compound material containing the element as its main constituent. Further, a semiconductor film typified by a crystalline silicon film introduced with an impurity element such as phosphorous may also be used. Also, an AgPdCu alloy may be used. Further, a combination of the first conductive film formed of a tantalum (Ta) film and the second conductive film formed of a W film, a combination of the first conductive film formed of a titanium nitride (TiN) film and the second conductive film formed is of a W film, a combination of the first conductive film formed of a tantalum nitride (TaN) film and the second conductive film formed of an Al film, and a combination of the first conductive film formed of a tantalum nitride (TaN), film and the second conductive film formed of a Cu film may be adopted.

Here, in order to make an internal stress in the second conductive film 516a a desired internal stress, introduction of a third impurity element is conducted. The introduction of the impurity element may be conducted by plasma doping, ion implantation or ion shower doping. Thus, the internal stress changes such that a compressive stress increases, thereby being capable of forming a second conductive film 516b having the desired internal stress. (FIG. 10D) In this embodiment, Ar as the impurity element is introduced with an accelerating voltage of 70 keV.

Next, a mask formed of resist (not shown) is formed by using photolithography, and an etching process for forming electrodes and wirings is conducted. In this embodiment, etching is conducted under the following etching conditions: ICP (inductively coupled plasma) etching is used; $CF_4$, $Cl_2$ and $O_2$ are used as an etching gas with a gas flow rate set to 25:25:10 (seem); and RF (13.56 MHz) power of 500 W is applied to a coil shape electrode at a pressure of 1 Pa to generate plasma. RF (13.56 MHz) power of 150 W is applied also to a substrate (sample stage) to apply a substantially negative self-bias voltage.

Then, introduction of a fourth impurity element is conducted to introduce an impurity element imparting n-type conductivity into the semiconductor layers. (FIG. 11A) The introduction of the impurity element is conducted with the conditions of a dose amount of $1\times10^{13}$ to $5\times10^{14}$/cm$^2$ and an accelerating voltage of 30 to 80 keV. In this embodiment, the introduction is conducted with a dose amount of $1.5\times10^{13}$/cm$^2$ and an accelerating voltage of 60 keV. As the impurity element imparting n-type conductivity, an element belonging to Group 15, typically phosphorous (P) or arsenic (As) is used, but phosphorous (P) is used here. In this case, conductive layers 517 to 521 become masks against the impurity element imparting n-type conductivity, and low concentration impurity regions 523 and 524 are formed in a self-aligning manner. The low concentration impurity regions 523 and 524 are added with the impurity element imparting n-type conductivity in a concentration range of $1\times10^{18}$ to $1\times10^{20}$/cm$^3$. Here, a mask 522 made of resist is formed to the semiconductor layer forming a p-channel TFT, and thus, the impurity element imparting n-type conductivity is not introduced thereinto.

Subsequently, the mask made of resist is removed, masks are newly formed, and introduction of a fifth impurity element is conducted as shown in FIG. 11B. The introduction of the impurity element is conducted with the conditions of a dose amount of $1\times10^{13}$ to $1\times10^{15}$/cm$^2$ and an accelerating voltage of 30 to 120 keV. At this time, a mask 525b is formed in order not to introduce an impurity element imparting n-type conductivity into the semiconductor layer forming the p-channel TFT, and masks 525a and 525c are formed in order to selectively form high concentration impurity regions in the semiconductor layers for forming n-channel TFTs. In this embodiment, the introduction is conducted with a dose amount of $2\times10^{15}$/cm$^2$ and an accelerating voltage of 50 keV. Thus, high concentration impurity regions 526 and 529 are formed.

Next, after the masks made of resist are removed, masks 532a and 532b made of resist are newly formed, and introduction of a sixth impurity element is conducted as shown in FIG. 11C. By conducting the introduction of the sixth impurity element, an impurity region 533 added with an impurity element imparting conductivity opposite to the above-mentioned one conductivity is formed in the semiconductor layer that becomes an active layer of the p-channel TFT. The second conductive layer 518 is used as a mask against the impurity element, and an impurity element imparting p-type conductivity is added to form the impurity region in a self-aligning manner. In this embodiment, the impurity region 533 is formed by ion shower doping using diborane ($B_2H_6$). Ion shower doping is conducted with the conditions of a dose amount of $1\times10^{13}$ to $1\times10^{14}$/cm$^2$ and an accelerating voltage of 30 to 120 keV. In the introduction of the sixth impurity element, the semiconductor layers forming the n-channel TFTs are covered with the masks 532a and 532b made of resist.

Next, the masks made of resist are removed, masks are newly formed, and introduction of a seventh impurity element is conducted as shown in FIG. 12A. The introduction of the impurity element is conducted with the conditions of a dose amount of $1\times10^{13}$ to $1\times10^{15}$/cm$^2$ and an accelerating voltage of 20 to 120 keV. At this time, masks 534a and 534c are formed in order not to introduce an impurity element imparting p-type conductivity into the semiconductor layers forming the n-channel TFTs, and a mask 534b is formed in order to selectively form a high concentration impurity region in the semiconductor layer for forming the p-channel TFT. In this embodiment, the introduction is conducted with the conditions of a dose amount of $1\times10^{15}/cm^2$ and an accelerating voltage of 40 keV. Thus, a high concentration impurity region 535 is formed.

By conducting the above-described steps, the high concentration impurity regions and the low concentration impurity regions are formed in the respective semiconductor layers.

Next, the masks 534a to 534c made of resist are removed, and a first interlayer insulating film 538 is formed. The first interlayer insulating film 538 is formed of an insulating film containing silicon to have a thickness of 100 to 200 nm by using is plasma CVD or sputtering. In this embodiment, a 150 nm thick silicon oxynitride film is formed by plasma CVD. Of course, the first interlayer insulating film 538 is not limited to the silicon oxynitride film, and other insulating films containing silicon may be used in a form of a single layer or a lamination structure.

Then, as shown in FIG. 12B, heat treatment is conducted to recover the crystallinity of the semiconductor layers and to activate the impurity elements added to the respective semiconductor layers. This heat treatment is conducted by using thermal annealing using an annealing furnace. It is sufficient that thermal annealing is conducted in a nitrogen atmosphere with an oxygen concentration of 1 ppm or less, preferably 0.1 ppm or less at 400 to 700° C., typically 500 to 550° C. In this embodiment, heat treatment at 550° C. for four hours is conducted for the activation process. Note that laser annealing or rapid thermal annealing (RTA) can be applied besides thermal annealing.

A laser used for laser activation is desirably a solid laser, gas laser or metal laser of continuous emission type or pulse oscillation type. If a continuous emission type laser is used, it is required that energy density of laser light is approximately 0.01 to 100 $MW/cm^2$ (preferably 0.01 to 10 $MW/cm^2$), and a substrate is moved at a speed of 0.5 to 2000 cm/s relatively to laser light. Further, if a pulse oscillation type laser is used, it is desirable that frequency is 300 Hz and laser energy density is 50 to 1000 $mJ/cm^2$ (typically 50 to 700 $mJ/cm^2$). At this time, laser light may be overlapped by 50 to 98%.

Further, the heat treatment may be conducted before the formation of the first interlayer insulating film. Note that, in a case where a wiring material used cannot withstand heat, the heat treatment is preferably conducted after the formation of the interlayer insulating film (insulating film containing silicon as its main constituent, for example, silicon nitride film) in order to protect wirings and the like as in this embodiment.

Then, heat treatment (heat treatment at 300 to 550° C. for 1 to 0.12 hours) is conducted, thereby being capable of conducting hydrogenation. This is a step of terminating dangling bonds of semiconductor layers by hydrogen contained in the first interlayer insulating film 538. Of course, the semiconductor layers can be hydrogenated irrespective of the existence of the first interlayer insulating film. As another means for hydrogenation, plasma hydrogenation (using hydrogen excited by plasma) or heat treatment in an atmosphere containing 3 to 100% hydrogen at 300 to 450° C. for 1 to 12 hours may be conducted.

Next, a second interlayer insulating film 539 formed from an inorganic insulating film material or organic insulator material is formed on the first interlayer insulating film 538. In this embodiment, a silicon oxynitride film having a thickness of 1 μm is formed.

Then, in a driver circuit 555, wirings 540 to 542 electrically connected with the respective impurity regions are formed. Further, in a pixel portion 556, source wirings 543, 545 and a drain wiring 544 are formed. These wirings are formed by patterning a lamination film of a 50 nm thick Ti film and a 500 nm thick alloy film (alloy film of Al and Ti).

Figure 13:
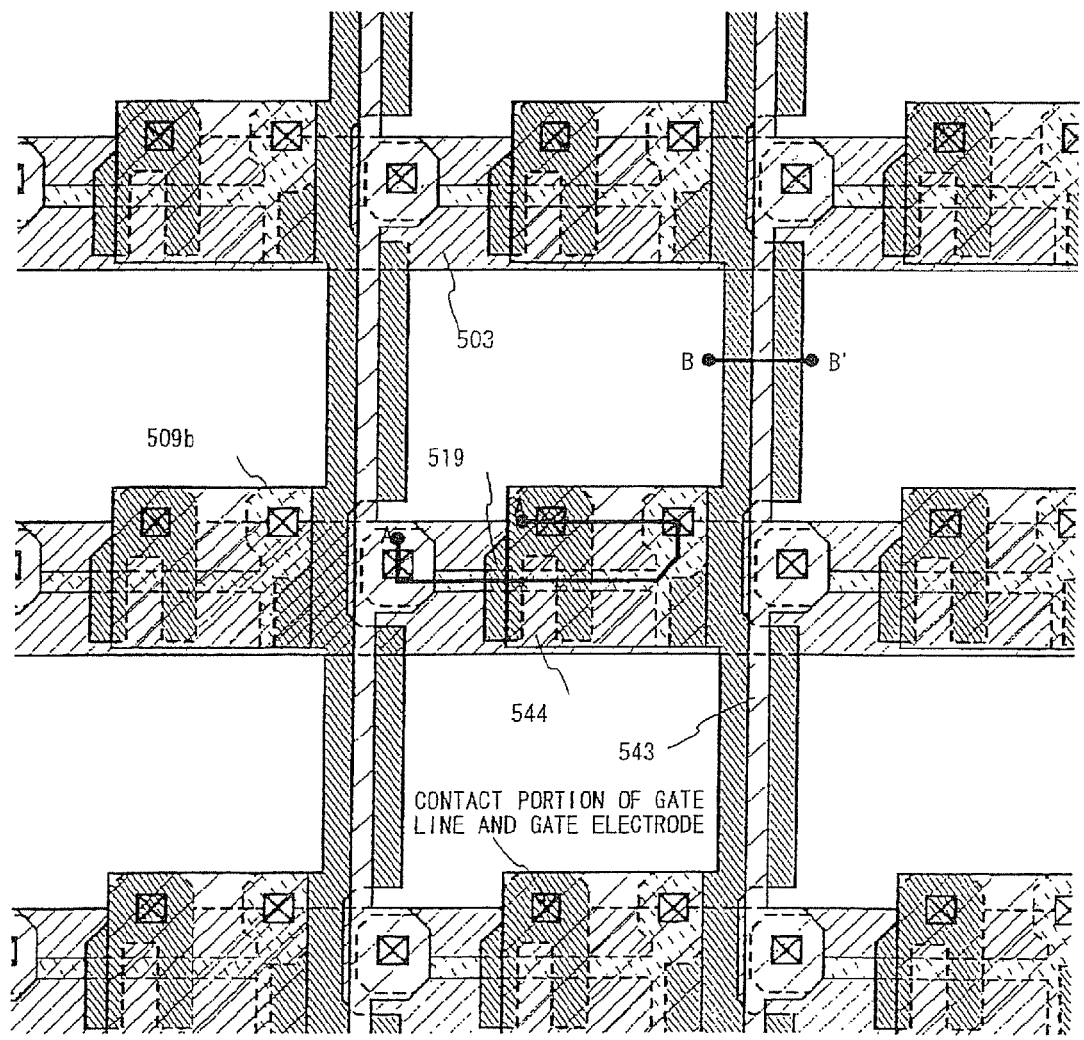
FIG. 13 is a top surface view showing a structure of the pixel TFT.

FIG. 13 is a top view showing a manufacturing state up through this step. Note to that the parts corresponding to those in FIGS. 9A to 12C are denoted by the same symbols as in FIGS. 9A to 12C. A chain line A-A' of FIG. 12C corresponds to a sectional view taken along the chain line A-A' of FIG. 13. Also, a chain line B-B' of FIG. 12C corresponds to a sectional view taken along the chain line B-B' of FIG. 13.

Subsequently, a third interlayer insulating film 560 formed from an inorganic 51 insulating film material or organic insulator material is formed on the second interlayer insulating film 539. In this embodiment, a silicon oxynitride film having a thickness of 1.8 μm is formed.

A film which is made from Al, Ti, W, Cr, black resin or the like and which has high light shielding property is patterned into a desired shape to thereby form light shielding films 561 and 562 on the third interlayer insulating film 560. The light shielding films 561, 562 are arranged in mesh so as to shield portions other than an opening portion of a pixel against light. Further, a fourth interlayer insulating film 563 is formed from an inorganic insulating material so as to cover the light shielding films 561, 562.

Then, a contact hole connecting with the connection wiring 544 is formed. Then, a transparent conductive film made of ITO or the like is formed to have a thickness of 100 nm, and this film is patterned into a desired shape to thereby form pixel electrodes 564 and 565.

From the above, an active matrix substrate in which the driver circuit 555 having an n-channel TFT 551 and a p-channel TFT 552 and the pixel portion 556 having a pixel TFT 553 and a storage capacitor 554 are formed on the same substrate is completed.

The internal stress of the gate electrode thus formed becomes a desired internal stress, and the stress applied to the semiconductor film can be reduced or set to the desired stress. Then, when a TFT is manufactured by using the gate electrode, the electric characteristics thereof become satisfactory, and the operational characteristics of a semiconductor device can be remarkably improved.

Note that this embodiment can be freely combined with Embodiment 2 or Embodiment 3. Of course, an active matrix substrate can be manufactured by using a TFT manufactured in Embodiment 4 or a MOSFET manufactured in Embodiment 5.

[Embodiment 7]

Figure 15:
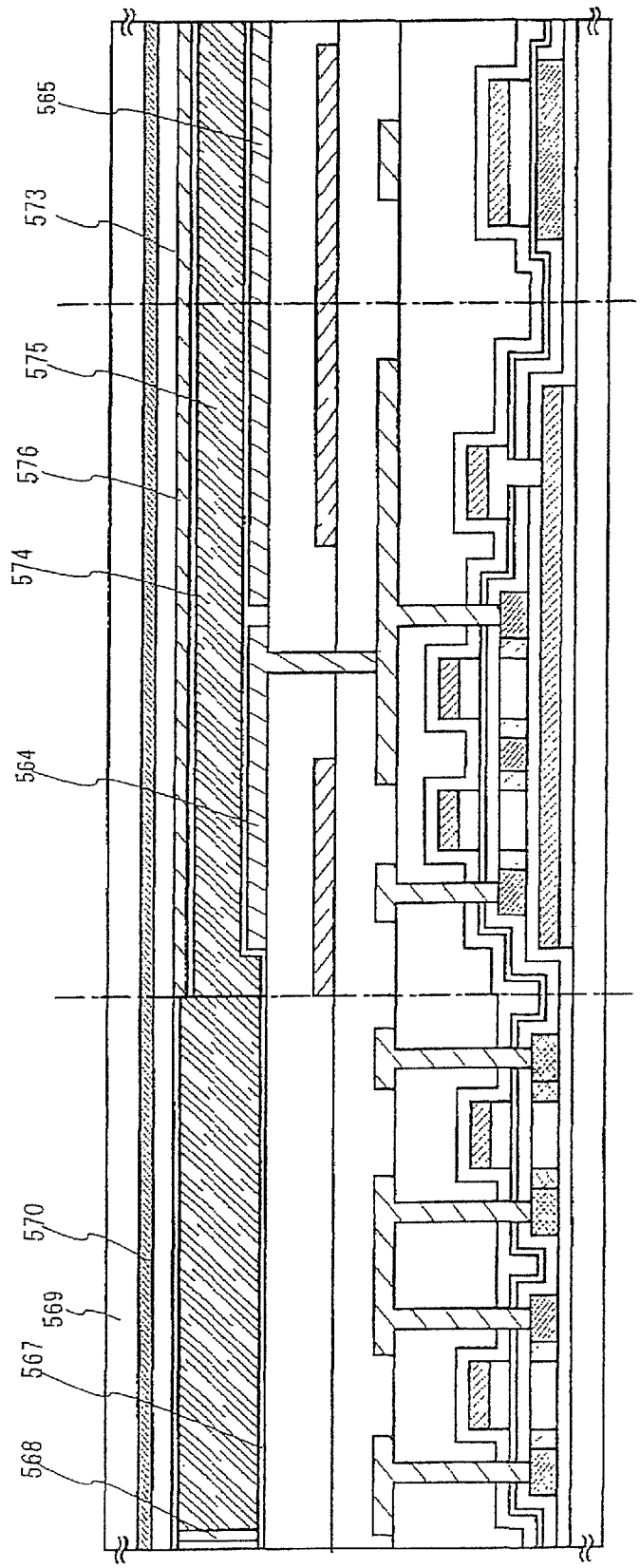
FIG. 15 is a sectional view showing a manufacturing process of an active matrix liquid crystal display device.

In this embodiment, a step of manufacturing a reflection type liquid crystal display device from the active matrix substrate manufactured in Embodiment 6 is described below. FIG. 15 is used for the explanation. Note that, although the present invention is not described in this embodiment, it can be said that the present invention is applied since the active matrix substrate manufactured in Embodiment 6 is used.

Figure 14A:
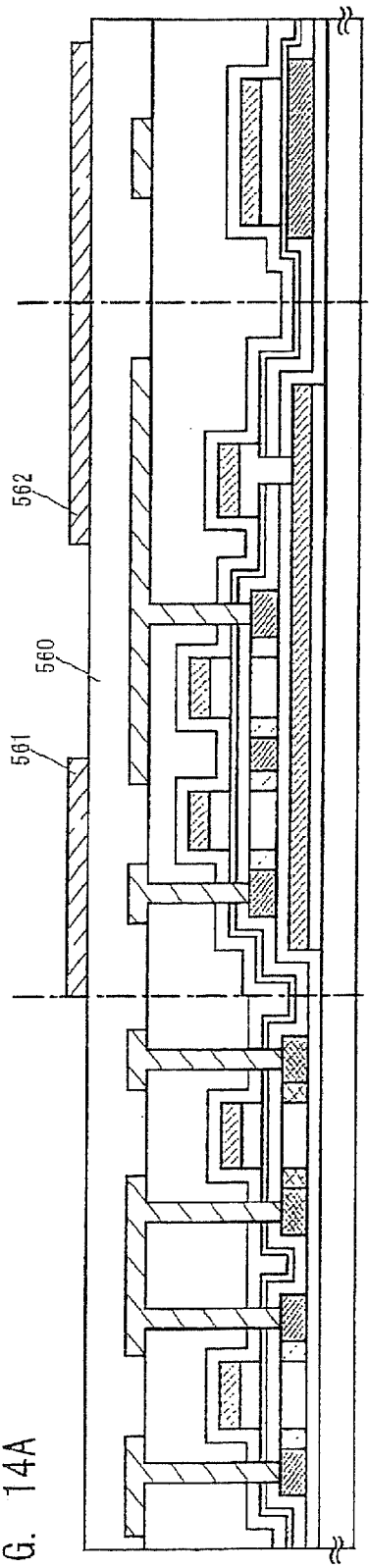
FIGS. 14A and 14B are sectional views showing the manufacturing process of a pixel TFT and a driver circuit TFT.
Figure 14B:
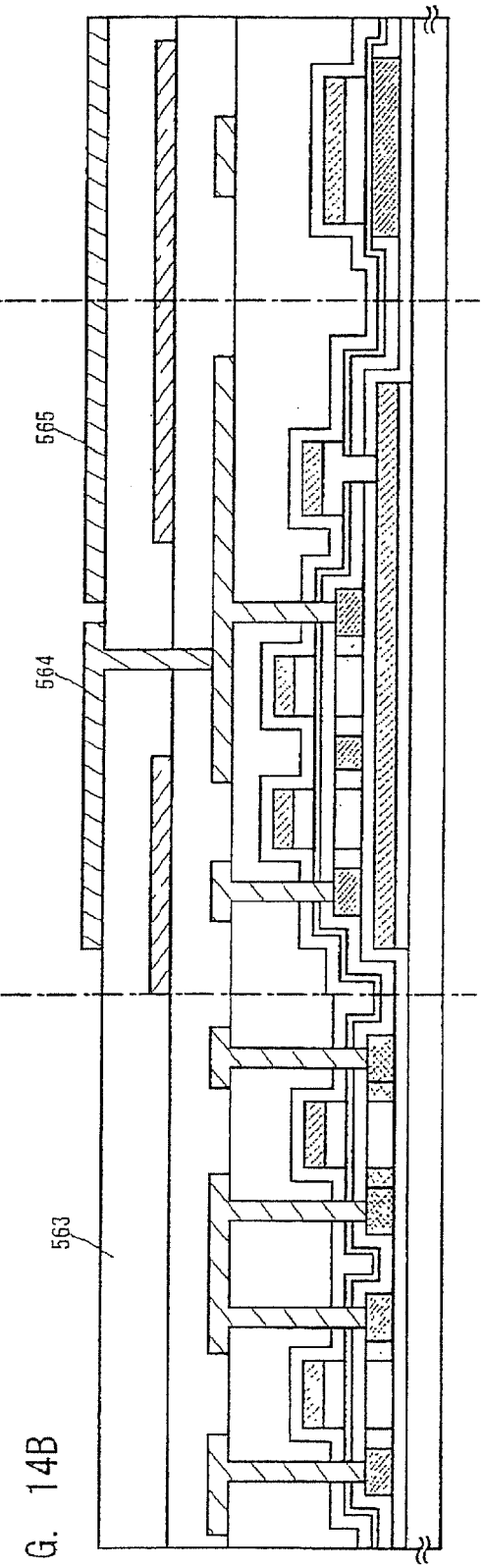

First, in accordance with Embodiment 6, the active matrix substrate in the state of FIG. 14B is obtained. Thereafter, an orientation film 567 is formed on the active matrix substrate, at least on the pixel electrodes 564, 565, and a rubbing process is performed. Note that, in this embodiment, an organic resin film such as an acrylic resin film is patterned before the formation of the orientation film 567, whereby a columnar spacer for keeping a substrate interval is formed at a desired position. Further, instead of the columnar spacer, spherical spacers may be scattered onto the entire surface of the substrate.

Next, an opposing substrate 569 is prepared. Then, a coloring layer 570 and a flattening film 573 are formed on the opposing substrate 569.

Next, on the flattening film 573, an opposing electrode 576 comprising a transparent conductive film is formed at least on the pixel portion. An orientation film 574 is formed on the entire surface of the opposing substrate, and a rubbing process is conducted thereto.

Then, the active matrix substrate on which the pixel portion and the driver circuit are formed and the opposing substrate are bonded by a sealing member 568. The sealing member 568 is mixed with filler, and the two substrates are bonded to each other with a uniform interval maintained by the filler and the columnar spacer. Thereafter, a liquid crystal material 575 is injected between both the substrates, and sealing is conducted completely by a sealant (not shown). A known liquid crystal material may be used for the liquid crystal material 575. Thus, a reflection type liquid crystal display device shown in FIG. 15 is completed. Then, if necessary, the active matrix substrate or the opposing substrate is cut into a desired shape. Further, a polarizing plate (not shown) is attached only to the opposing substrate. Then, an FPC is attached by using a known technique.

In the liquid crystal display device manufactured as described above, since an internal stress of a gate electrode is controlled to a desired level, the stress applied to the semiconductor film can also be reduced, and the operational characteristics of the liquid crystal display device can be remarkably improved. Further, the liquid crystal display device can be used for display portions of various electronic equipment.

Note that this embodiment can be freely combined with Embodiment 2, Embodiment 3 or Embodiment 6.

[Embodiment 8]

In this embodiment, an example in which a light emitting device is manufactured by applying the present invention will be described. Note that, although the present invention is not described in this embodiment, it can be said that the present invention is applied since the active matrix substrate manufactured in Embodiment 6 is used. In this specification, the light emitting device is the generic name for a display panel in which a light emitting element formed on a substrate is enclosed between the substrate and a cover member and a display module in which the is display panel is mounted with an IC (integrated circuit). Note that the light emitting element has a layer (light emitting layer) containing an organic compound in which luminescence generated by application of electric field (electro-luminescence) is obtained, an anode layer and a cathode layer. Further, the luminescence in the organic compound includes light emission in returning to a base state from a singlet excitation state (fluorescence) and light emission in returning to a base state from a triplet excitation state (phosphorescence), and the light emitting device includes any one or both of the types of light emission.

Note that, in this specification, all the layers formed between the anode and the cathode in the light emitting element are defined as organic light emitting layers. The organic light emitting layers specifically include a light emitting layer, a hole injection layer, an electron injection layer, a hole transportation layer, an electron transportation layer and the like. The light emitting element basically has a structure in which an anode layer, a light emitting layer and a cathode layer are laminated in order. In addition to this structure, a structure in which an anode layer, a hole injection layer, a light emitting layer and a cathode layer are laminated in order, a structure in which an anode layer, a hole injection layer, a light emitting layer, an electron transportation layer and a cathode layer are laminated in order, or the like may also be adopted.

Figure 16:
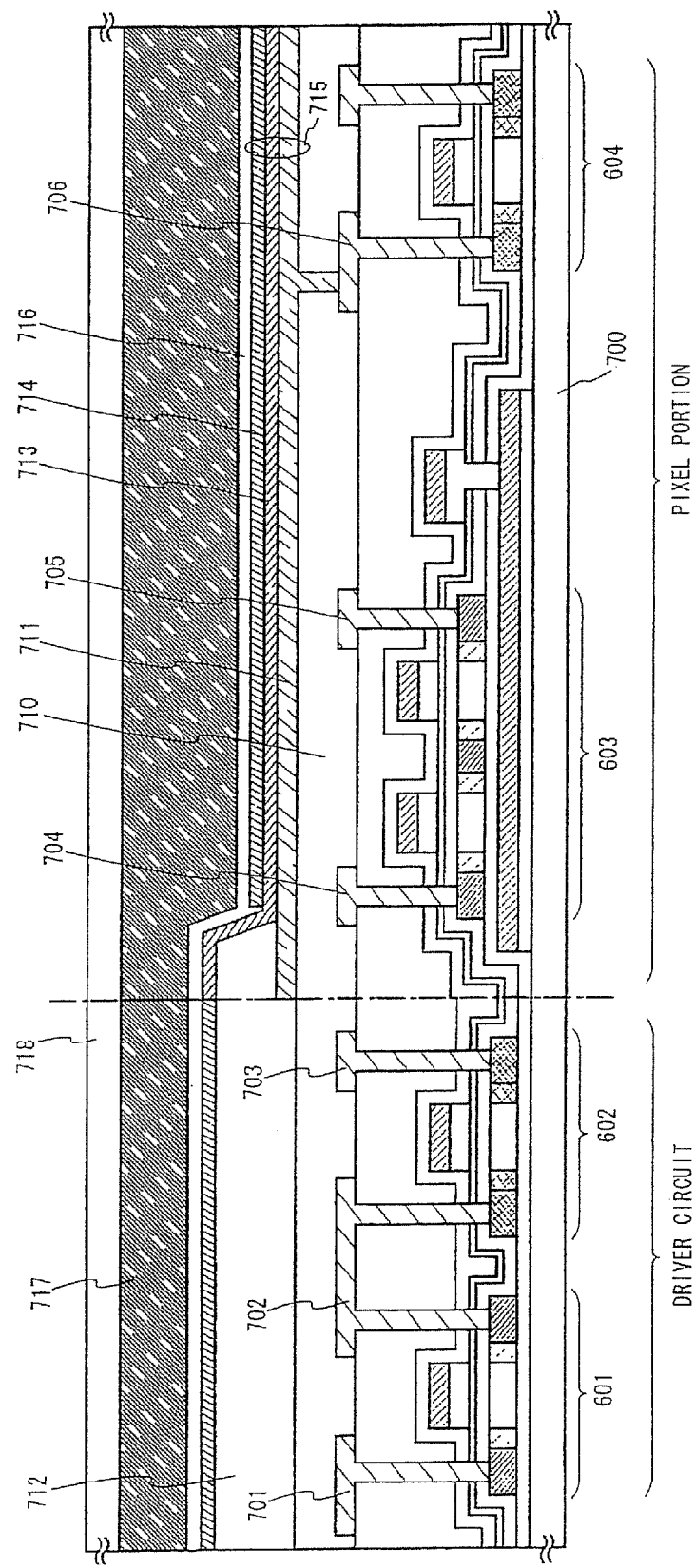
FIG. 16 is a sectional view showing a driver circuit and a pixel portion of a light emitting device.

FIG. 16 is a sectional view of the light emitting device in this embodiment. In FIG. 16, a driver circuit provided on a substrate 700 is formed by using the CMOS circuit in FIG. 12. Therefore, the description for the n-channel TFT 551 and the p-channel TFT 552 may be referred to for the description of the structure of the driver circuit. Ar is introduced into the gate electrodes of the n-channel TFT 551 and the p-channel TFT 552, whereby the internal stresses of the gate electrodes are controlled, and the stress applied to a semiconductor film is reduced. Therefore, the electric characteristics of the TFT can be improved. Note that a single gate structure is adopted in this embodiment, but a double gate structure or a triple gate structure may also be adopted.

A switching TFT 603 provided on the substrate 700 is formed using the n-channel TFT 551 in FIG. 12C. Therefore, the description of the n-channel TFT 551 may be referred to for the description of the structure of the switching TFT 603. Ar is introduced into the gate electrode of the n-channel TFT 551, whereby the internal stress is controlled, and the stress applied to the semiconductor film is reduced. Therefore, the electric characteristics of the TFT can be improved.

Note that a double gate structure in which two channel forming regions are formed is taken in this embodiment, but a single gate structure in which one channel forming region is formed or a triple gate structure in which three channel forming regions are formed may also be adopted.

Further, wirings 701 and 703 function as source wirings of the CMOS circuit, and a wiring 702 functions as a drain wiring. Moreover, a wiring 704 functions as a wiring that electrically connects a source wiring (not shown) to a source region of the switching TFT, and a wiring 705 functions as a wiring that electrically connects a drain wiring (not shown) to a drain region of the switching TFT.

Note that a current control TFT 604 is formed by using the p-channel TFT 552 in FIG. 12C. Therefore, the description of the p-channel TFT 552 may be referred to for the description of the structure of the current control TFT 604. Ar is introduced into the gate electrode of the p-channel TFT 552, whereby the internal stress is controlled, and the stress applied to the semiconductor film is reduced. Therefore, the electric characteristics of the TFT can be improved. Note that the single gate structure is adopted in this embodiment, but the double gate structure or the triple gate structure may also be adopted.

Further, a wiring 706 is a source wiring of the current control TFT (corresponding to a current supply line), and is an electrode that electrically-connects-a pixel electrode 711.

Further, reference numeral 711 indicates the pixel electrode (anode of the light emitting element) formed of a transparent conductive film. A compound of indium oxide and tin oxide, a compound of indium oxide and zinc oxide, zinc oxide, tin oxide or indium oxide can be used for the transparent conductive film. Further, the transparent conductive film added with gallium may also be used. The pixel electrode 711 is formed on a flat interlayer insulating film 710 before the formation of the above wirings. In this embodiment, it is very important that a step caused by the TFT is flattened by using the flattening film 710 made of resin. Since a light emitting layer formed later is very thin, there is a case where light emission defect is caused due to the existence of the step. Therefore, flattening is desirably performed before the formation of the pixel electrode in order that the light emitting layer is formed on a surface that is as flat as possible.

After the formation of the pixel electrode 711, a bank 712 is formed as shown in FIG. 16. The bank 712 may be formed by patterning an insulating film containing silicon or organic resin film with a thickness of 100 to 400 nm.

Note that, since the bank 712 is formed of the insulating film, attention has to be paid on electrostatic discharge damage of the element at the time of film formation. In this embodiment, carbon particles or metallic particles are added into the insulating film that is the material for the bank 712 to lower the resistivity of the insulating film, whereby occurrence of static electricity is suppressed. At this time, the addition amount of the carbon particles or metallic particles may be adjusted such that the resistivity is $1\times10^6$ to $1\times10^{12}$ $\Omega$m (preferably $1\times10^8$ to $1\times10^{10}$ $\Omega$m).

A light emitting layer 713 is formed on the pixel electrode 711. Note that, although only one pixel is shown in FIG. 16, light emitting layers corresponding to respective colors of R (red), G (green) and B (blue) are separately formed in this embodiment. Further, a low molecular weight organic light emitting material is formed by evaporation in this embodiment. Specifically, a lamination structure is adopted in which a copper phthalocyanine (CuPc) film with a thickness of 20 nm is provided as a hole injection layer and a tris-8-quinolinolate aluminum complex ($Alq_3$) film with a thickness of 70 nm is provided thereon as a light emitting layer. $Alq_3$ is added with a fluorescent pigment such as quinacridon, perylene or DCM1, whereby a light emission color can be controlled.

Note that, the above example is one example of an organic light emitting material that can be used for a light emitting layer, and the present invention is not limited to the above example. It is sufficient that the light emitting layer (layer for light emission and movement of carrier for light emission) is formed by freely combining a light emitting layer, a charge transportation layer and a charge injection layer. For example, an example in which a low molecular weight organic light emitting material is used for the light emitting layer is shown in this embodiment, but a middle molecular weight organic light emitting material or polymer organic light emitting material may also be used. Note that, in this specification, the middle molecular weight light emitting material indicates an organic light emitting material which does not have sublimation property and in which the number of molecules is 20 or less or the length of chained molecules is 10 μm or less. Further, as an example in which the polymer organic light emitting material is used, a lamination structure may be adopted in which a 20 nm thick polythiophene (PEDOT) film is formed as a is hole injection layer by spin coating, and a paraphenylene vinylene (PPV) film with a thickness of approximately 100 nm is provided thereon as a light emitting layer. Note that, if π-conjugated polymer of PPV is used, light emission wavelength can be selected from red color to blue color. Further, an inorganic material such as silicon carbide can also be used for the charge transportation layer or charge injection layer. Known materials can be used for these organic light emitting materials and inorganic materials.

Next, a cathode 714 comprising a conductive film is provided on the light emitting layer 713. In this embodiment, an alloy film of aluminum and lithium is used as the conductive film. Of course, a known MgAg film (alloy film of magnesium and silver) may be used. A conductive film formed from an element belonging to Group 1 or Group 2 of the periodic table or a conductive film added with the above element may be used for the cathode material.

At the time when the process up through the formation of the cathode 714 is finished, a light emitting element 715 is completed. Note that the light emitting element 715 mentioned here indicates a diode constituted of the pixel electrode (anode) 711, the light emitting layer 713 and the cathode 714.

It is effective that a passivation film 716 is provided so as to completely cover the light emitting element 715. The passivation film 716 comprises an insulating film containing a carbon film, a silicon nitride film or a silicon oxynitride film, and a single layer or a lamination layer of the insulating film is used.

In this case, it is preferable to use a film having high coverage as the passivation film, and it is effective to use a carbon film, particularly, a DLC (diamond-like carbon) film. The DLC film can be deposited in a temperature range from room temperature to 100° C., and thus, it can be easily deposited above the light emitting layer 713 having low heat resistance. Further, the DLC film has a high blocking effect against oxygen, and can suppress oxidization of the light emitting layer 713. Therefore, the problem in that the light emitting layer 713 is oxidized during the subsequent sealing step can be prevented.

Further, a sealing material 717 is provided on the passivation film 716, and a cover member 718 is attached thereto. A ultraviolet curing resin may be used for the sealing material 717, and it is effective that a substance having a moisture absorption effect or a substance having an antioxidant effect is provided in the sealing material. Further, in this embodiment, a glass substrate, a quartz substrate, or a plastic substrate (including a plastic film) in which carbon films (preferably diamond-like carbon films) are formed on both surfaces is used as the cover member 718.

The light emitting device having the structure as shown in FIG. 16 is thus completed. Note that, it is effective to perform continuous processing without exposure to an atmosphere with a film forming apparatus of a multi-chamber system (or in-line system) as to the steps up through the formation of the passivation film 716 after the formation of the bank 712. Further, in a further-developed manner, it is possible to conduct continuous processing without exposure to an atmosphere for the steps up through bonding of the cover member 718.

Further, only the structure of the pixel portion and driver circuit is shown in this embodiment. However, in accordance with the manufacturing process in this embodiment, in addition, logic circuits such as a signal dividing circuit, a D/A converter, an operational amplifier and a γ-correction circuit can also be formed on the same insulator, and further, a memory and a microprocessor can be formed.

Furthermore, the light emitting device in this embodiment which has undergone the steps up through the sealing (or enclosing) step for protecting the light emitting element is described with reference to FIG. 17. Note that the reference numerals used in FIG. 16 are referred to if necessary.

FIG. 17A is a top surface view of the light emitting device in the state that the steps up through sealing of the light emitting element have been conducted, and FIG. 17B is a sectional view taken along the line C-C' of FIG. 17A. Reference numeral 801 shown by a dotted line indicates a source side driver circuit, reference numeral 806 indicates a pixel portion, and reference numeral 807 indicates a gate side driver circuit. Further, reference numeral 901 indicates a cover member, 902 indicates a first sealing member, and 903 indicates a second sealing member. A sealing material 907 is provided in the inside surrounded by the first sealing member 902.

Note that reference numeral 904 indicates a wiring for transmitting signals input to the source side driver circuit 801 and the gate side driver circuit 807, and the wiring receives a video signal or a clock signal from an FPC (flexible printed circuit) 905 that is an external input terminal. Note that only the FPC is shown here, but a printed wiring board (PWB) may be attached to the FPC. The light emitting device in this specification includes not only the light emitting device main body but also the light emitting device attached with the FPC or PWB.

Next, the cross sectional structure is described with reference to FIG. 17B. The pixel portion 806 and the gate side driver circuit 807 are formed above the substrate 700, and the pixel portion 806 is constituted of a plurality of pixels each including the current control TFT 604 and the pixel electrode 711 electrically connected to a drain of the TFT. Further, the gate side driver circuit 807 is formed by using a CMOS circuit comprising combination of the n-channel TFT 601 and the p-channel TFT 602 (see FIG. 16).

The pixel electrode 711 functions as an anode of the light emitting element. Further, the bank 712 is formed on both sides of the pixel electrode 711, and the light emitting layer 713 and the cathode 714 of the light emitting element are formed on the pixel electrode 711.

The cathode 714 functions as a common wiring to all the pixels, and is electrically connected to the FPC 905 via the connection wiring 904. Further, all the elements included in the pixel portion 806 and the gate side driver circuit 807 are covered with the cathode 714 and the passivation film 716.

Further, the cover member 901 is attached by the first sealing member 902. Note that, a spacer made of a resin film may be provided in order to secure an interval between the cover member 901 and the light emitting element. Then, the sealing material 907 is filled in the inside of the first sealing member 902. Note that epoxy-based resin is preferably used for the fist sealing member 902 and the sealing material 907. Further, it is desirable that the first sealing member 902 is formed from a material that is not permeated with moisture or oxygen as much as possible. Further, a substance having moisture absorption effect or a substance having an antioxidant effect may be contained in the sealing material 907.

The sealing material 907 provided so as to cover the light emitting element functions as an adhesive for adhering the cover member 901. Further, in this embodiment, as a material for a plastic substrate constituting the cover member 901. FRP (fiberglass-reinforced plastics), PVF (polyvinyl fluoride), Mylar, polyester or acrylic can be used.

Further, after the cover member 901 is adhered using the sealing material 907, the second sealing member 903 is provided so as to cover a side surface (exposing surface) of the sealing material 907. The second sealing member 903 can be formed from the same material as that for the first sealing member 902.

The light emitting element is enclosed into the sealing material 907 with the above-described structure, whereby the light emitting element can be completely shut from the outside, and a substance that promotes deterioration due to oxidization of the light emitting layer, such as moisture or oxygen, can be prevented from being permeated from the outside. Therefore, the light emitting device with high reliability can be obtained.

In the light emitting device manufactured as described above, the internal stress of the gate electrode is controlled to a desired level. Thus, the stress applied to the semiconductor film can be reduced, and the operational characteristics of the light emitting device can be remarkably improved. The above-described light emitting device can be used for display portions of various types of electronic equipment.

Note that this embodiment can be freely combined with Embodiment 2, Embodiment 3 or Embodiment 6.

[Embodiment 9]

The CMOS circuit and the pixel portion formed by implementing the present invention can be used in various electro-optical devices (active matrix type liquid crystal display device, active matrix type EC display device and active matrix type light emitting device). That is, the present invention can be implemented in all of electronic apparatuses integrated with the electro-optical devices at display portions thereof.

As such electronic apparatuses, there are pointed out a video camera, a digital camera, a projector, a head mount display (goggle type display), a car navigation system, a car stereo, a personal computer, a portable information terminal (mobile computer, mobile telephone or electronic book) and the like. Examples of these are is shown in FIG. 18A through 18F, FIG. 19A through 19D and FIG. 20A through 20C.

Figure 18A:
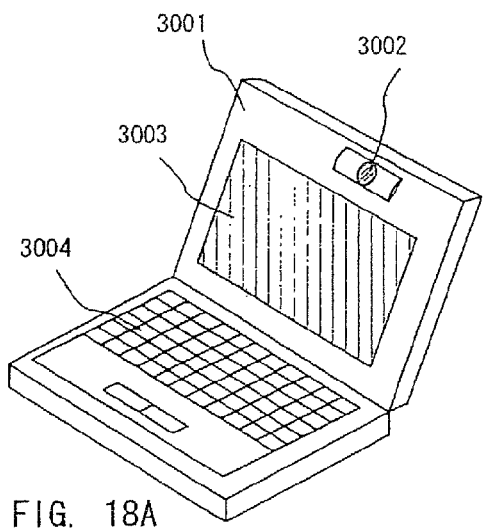
FIGS. 18A to 18F are diagrams of examples of semiconductor devices.

FIG. 18A shows a personal computer including a main body 3001, an image input portion 3002, a display portion 3003 and a keyboard 3004. The present invention can be applied to the display portion 3003.

Figure 18B:
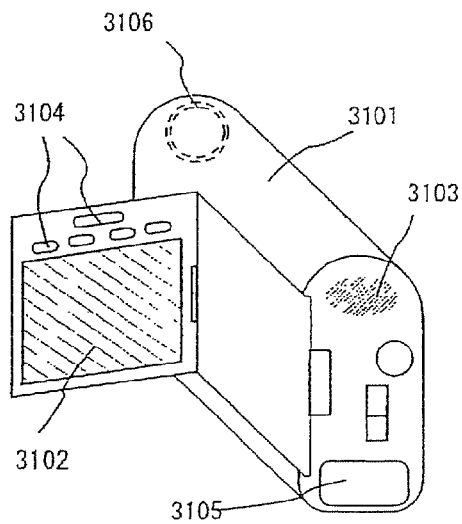

FIG. 18B shows a video camera including a main body 3101, a display portion 3102, a voice input portion 3103, operation switches 3104, a battery 3105 and an image receiving portion 3106. The present invention can be applied to the display portion 3102.

Figure 18C:
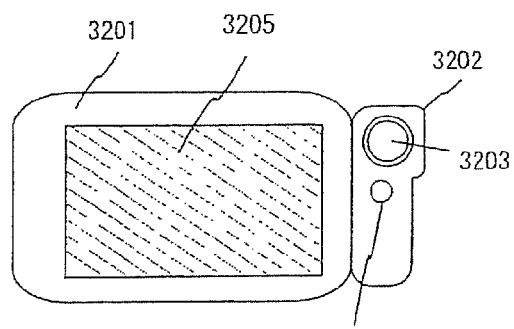

FIG. 18C shows a mobile computer including a main body 3201, a camera portion 3202, an image receiving portion 3203, an operation switch 3204 and a display portion 3205. The present invention can be applied to the display portion 3205.

Figure 18D:
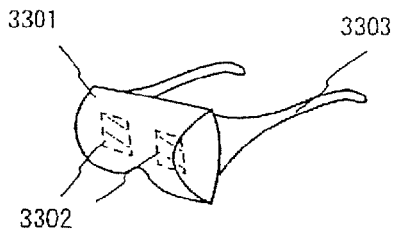

FIG. 18D shows a goggle type display including a main body 3301, a display portion 3302 and an arm portion 3303. The present invention can be applied to the display portion 3302.

Figure 18E:
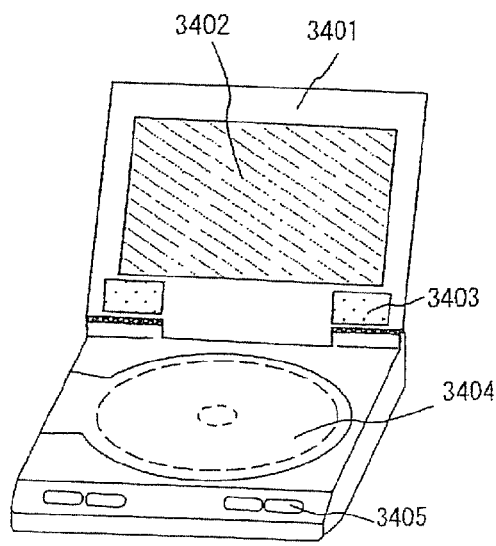

FIG. 18E shows a player using a record medium recorded with programs (hereinafter, referred to as record medium) including a main body 3401, a display portion 3402, a speaker portion 3403, a record medium 3404 and an operation switch 3405. The player uses DVD (Digital Versatile Disc) or CD as the record medium and can enjoy music, enjoy movie and carry out game or Internet. The present invention can be applied to the display portion 3402.

Figure 18F:
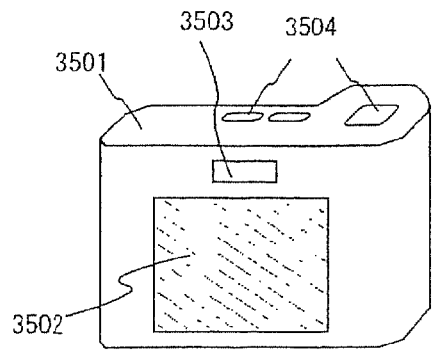

FIG. 18F shows a digital camera including a main body 3501, a display portion 3502, an eye contact portion 3503, operation switches 3504 and an image receiving portion (not illustrated). The present invention can be applied to the display portion 3502.

Figure 19A:
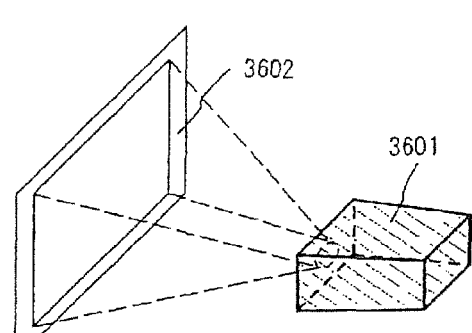
FIGS. 19A to 19D are diagrams of examples of semiconductor devices.

FIG. 19A shows a front type projector including a projection apparatus 3601 and a screen 3602. The present invention can be applied to a liquid crystal display device 3808 which structures a portion of the projecting apparatus 3601; and to other driver circuits.

Figure 19B:
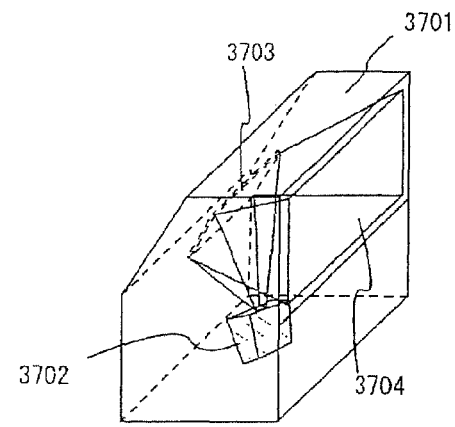

FIG. 19B shows a rear type projector including a main body 3701, a projection apparatus 3702, a mirror 3703 and a screen 3704. The present invention can be applied to a liquid crystal display device 3808 which structures a portion of the projecting apparatus 3702, and to other signal control circuits.

Figure 19C:
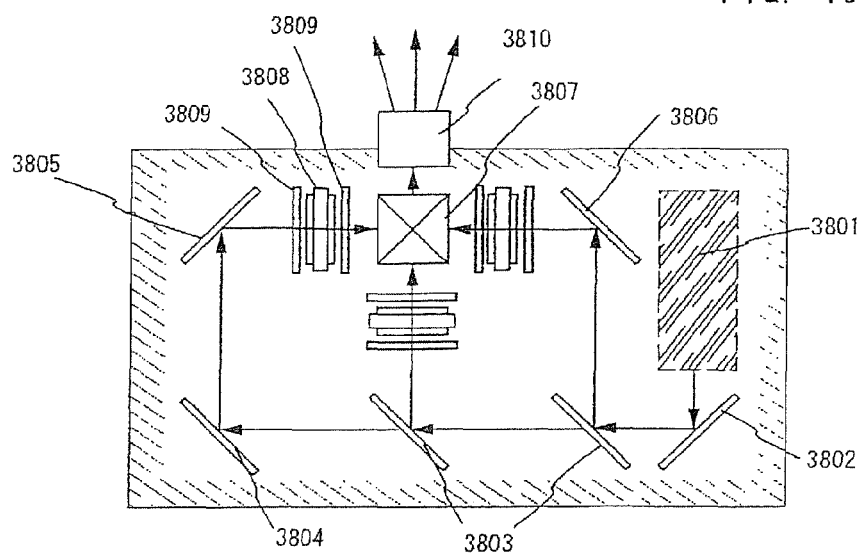

Further, FIG. 19C is a view showing an example of a structure of the projection apparatus 3601 and 3702 in FIG. 19A and FIG. 19B, respectively. The projection apparatus 3601 or 3702 is constituted by a light source optical system 3801, mirrors 3802, and 3804 through 3806, a dichroic mirror 3803, a prism 3807, a liquid crystal display apparatus 3808, a phase difference plate 3809 and a projection optical system 3810. The projection optical system 3810 is constituted by an optical system including a projection lens. Although the embodiment shows an example of three plates type, the embodiment is not particularly limited thereto but may be of, for example, a single plate type. Further, a person of executing the embodiment may pertinently provide an optical system such as an optical lens, a film having a polarization function, a film for adjusting a phase difference or an IR film in an optical path shown by arrow marks in FIG. 19C.

Figure 19D:
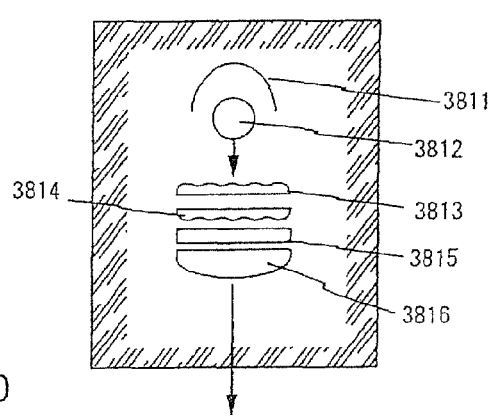

Further, FIG. 19D is a view showing an example of a structure of the light source optical system 3801 in FIG. 19C.

According to this embodiment, the light source optical system 3801 is constituted by a reflector 3811, a light source 3812, lens arrays 3813 and 3814, a polarization conversion element 3815 and a focusing lens 3816. Further, the light source optical system shown in FIG. 19D is only an example and the embodiment is not particularly limited thereto. For example, a person of executing the embodiment may pertinently provide an optical system such as an optical lens, a film having-a-polarization function, a film for adjusting a phase difference or an IR film in the light source optical system.

However, according to the projectors shown in FIGS. 19A, 19B and 19C, there is shown a case of using a transmission type electro-optical apparatus and an example of applying a reflection type electro-optical apparatus and light emitting device are not illustrated.

Figure 20A:
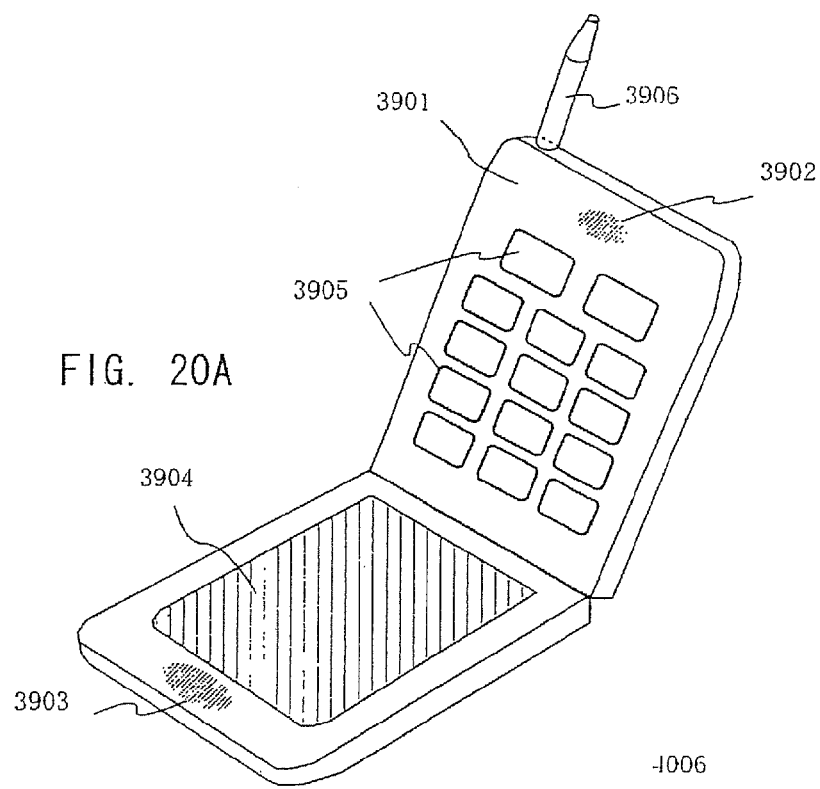
FIGS. 20A to 20C are diagrams of examples of semiconductor devices.

FIG. 20A shows a mobile telephone including a display portion 3901, a sound output portion 3902, a sound input portion 3903, a display portion 3904, operation switches 3905 and an antenna 3906. The present invention can be applied to the display portion 3904.

Figure 20B:
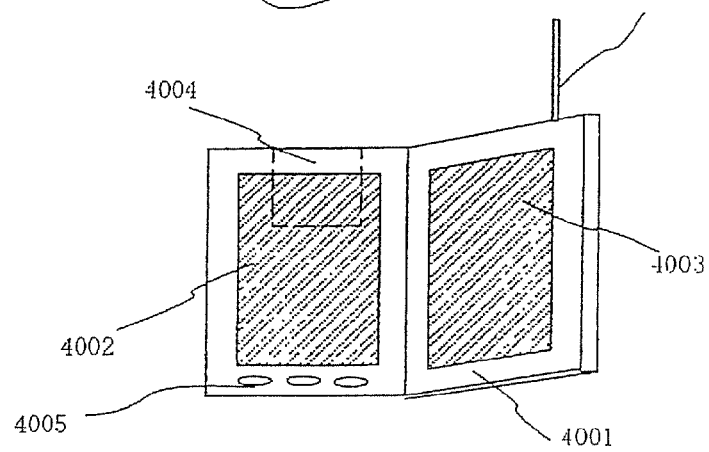

FIG. 20B shows a portable book (electronic book) including a main body 4001, display portions 4002 and 4003, a record medium 4004, an operation switch 4005 and an antenna 4006. The present invention can be applied to the display portions 4002 and 4003.

Figure 20C:
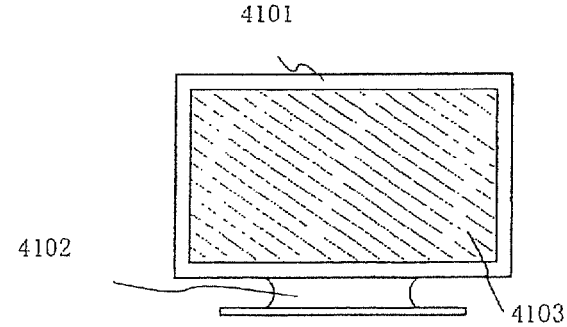

FIG. 20C shows a display including a main body 4101, a support base 4102 and a display portion 4103. The present invention can be applied to the display portion 4103. The display according to the invention is advantageous particularly in the case of large screen formation and is advantageous in the display having a diagonal length of 10 inches or more (particularly, 30 inches or more).

As has been described, the range of applying the invention is extremely wide and is applicable to electronic apparatus of all the fields. Further, the electronic apparatus of this embodiment can be realized by using any constitution comprising any combinations of Embodiments 2 to 7. Embodiment 8 can be applied to the is electronic apparatus shown in FIG. 8 and FIG. 20.

By adopting the structure of the present invention, the following significance can be obtained.

(a) A simple method is provided which is adapted to the conventional manufacturing process.

(b) The formation of the wiring having a desired internal stress can be realized. Therefore, the stress in other films can also be reduced. Further, a wiring patterning process can be satisfactorily performed. In particular, when the present invention is applied to the gate electrode, the stress applied to the active layer (particularly channel forming region) can be controlled.

(c) In addition to the above advantages, the TFT with satisfactory electric characteristics such as the threshold voltage and field effect mobility can be manufactured. Further, in the semiconductor device typified by the active matrix liquid crystal display device manufactured by using the above-described TFT, the operational characteristics of the semiconductor device can be improved, and the improvement of yield can be realized.

What is claimed is:

1. A semiconductor device comprising:
an n-channel transistor comprising:
a first semiconductor; and
a first conductive film over the first semiconductor; and
a p-channel transistor comprising:
a second semiconductor; and
a second conductive film over the second semiconductor,
wherein the first semiconductor receives a tensile stress,
wherein the second semiconductor receives a compressive stress, and
wherein a first impurity element is introduced into at least one of the first conductive film and the second conductive film.

2. The semiconductor device according to claim 1, wherein the first rare gas element is argon.

3. The semiconductor device according to claim 1, wherein a peak concentration of the first rare gas element in the first conductive film or the second conductive film is in a range of $1\times10^{17}$ to $1\times10^{22}$ /cm$^3$.

4. The semiconductor device according to claim 1,
wherein the first rare gas element is included in the first conductive film,
wherein a second rare gas element is included in the second conductive film, and
wherein a concentration of the first rare gas element differs from a concentration of the second rare gas element.

5. The semiconductor device according to claim 1, wherein the first semiconductor and the second semiconductor are provided over an insulating surface.

6. The semiconductor device according to claim 1, wherein the n-channel transistor and the p-channel transistor are formed on a single crystal semiconductor substrate.

7. The semiconductor device according to claim 1, wherein the first conductive film and the second conductive film comprise tungsten.

8. The semiconductor device according to claim 7, wherein the first conductive film and the second conductive film comprising tungsten are formed by sputtering or thermal CVD.

9. A semiconductor device comprising:
a driver circuit, the driver circuit comprising:
an n-channel transistor comprising:
a first semiconductor; and
a first conductive film over the first semiconductor; and
a p-channel transistor comprising:
a second semiconductor; and
a second conductive film over the second semiconductor,
wherein the first semiconductor receives a tensile stress,
wherein the second semiconductor receives a compressive stress, and
wherein a first rare gas element is included in at least one of the first conductive film and the second conductive film.

10. The semiconductor device according to claim 9, wherein the first rare gas element is argon.

11. The semiconductor device according to claim 9, wherein a peak concentration of the first rare gas element in the first conductive film or the second conductive film is in a range of $1\times10^{17}$ to $1\times10^{22}$ /cm$^3$.

12. The semiconductor device according to claim 9,
wherein the first rare gas element is included in the first conductive film,
wherein a second rare gas element is included in the second conductive film, and
wherein a concentration of the first rare gas element differs from a concentration of the second rare gas element.

13. The semiconductor device according to claim 9, wherein the first semiconductor and the second semiconductor are provided over an insulating surface.

14. The semiconductor device according to claim 9, wherein the n-channel transistor and the p-channel transistor are formed on a single crystal semiconductor substrate.

15. The semiconductor device according to claim 9, wherein the first conductive film and the second conductive film comprise tungsten.

16. The semiconductor device according to claim 15, wherein the first conductive film and the second conductive film comprising tungsten are formed by sputtering or thermal CVD.

17. A semiconductor device comprising:
an n-channel transistor comprising:
a first semiconductor in contact with an insulating surface; and
a first conductive film over the first semiconductor; and
a p-channel transistor comprising:
a second semiconductor in contact with the insulating surface; and
a second conductive film over the second semiconductor,
wherein the first semiconductor receives a tensile stress,
wherein the second semiconductor receives a compressive stress, and
wherein a first rare gas element is included in at least one of the first conductive film and the second conductive film.

18. The semiconductor device according to claim 17, wherein the first rare gas element is argon.

19. The semiconductor device according to claim 17, wherein a peak concentration of the first rare gas element in the first conductive film or the second conductive film is in a range of $1 \times 10^{17}$ to $1 \times 10^{22}$ /cm$^3$.

20. The semiconductor device according to claim 17,
wherein the first rare gas element is included in the first conductive film,
wherein a second rare gas element is included in the second conductive film, and
wherein a concentration of the first rare gas element differs from a concentration of the second rare gas element.

21. The semiconductor device according to claim 17, wherein the first conductive film and the second conductive film comprise tungsten.

* * * * *